US011967983B2

(12) United States Patent
Zeng et al.

(10) Patent No.: US 11,967,983 B2
(45) Date of Patent: Apr. 23, 2024

(54) ULTRA WIDEBAND TRANSMITTER

(71) Applicant: QUALCOMM Incorporated, San Diego, CA (US)

(72) Inventors: Yi Zeng, San Jose, CA (US); Cheng-Han Wang, San Jose, CA (US); Emanuele Lopelli, Laguna Niguel, CA (US); Chan Hong Park, San Jose, CA (US); Liang Zhao, Saratoga, CA (US); Le Nguyen Luong, San Diego, CA (US); Koorosh Akhavan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 13 days.

(21) Appl. No.: 17/934,513

(22) Filed: Sep. 22, 2022

(65) Prior Publication Data

US 2024/0106496 A1 Mar. 28, 2024

(51) Int. Cl.
H04B 1/717 (2011.01)
H03F 3/24 (2006.01)

(52) U.S. Cl.
CPC .......... *H04B 1/7174* (2013.01); *H03F 3/245* (2013.01); *H03F 2200/09* (2013.01); *H03F 2200/451* (2013.01)

(58) Field of Classification Search
CPC ... H04B 1/7174; H03F 3/245; H03F 2200/09; H03F 2200/451
See application file for complete search history.

(56) References Cited

U.S. PATENT DOCUMENTS 6,985,532 B2 * 1/2006 Batra ................... H04B 1/7174
  375/245
11,057,009 B2 * 7/2021 Seckin ................... H03F 3/2173
(Continued)

FOREIGN PATENT DOCUMENTS

CN 114826844 A 7/2022
CN 115333553 A 11/2022

OTHER PUBLICATIONS

De Streel G., et al., "SleepTalker: A ULV 802.15.4a IR-UWB Transmitter SoC in 28-nm FDSOI Achieving 14 pJ/b at 27 Mb/s With Channel Selection Based on Adaptive FBB and Digitally Programmable Pulse Shaping", IEEE Journal of Solid-state Circuits, IEEE, USA, vol. 52, No. 4, Apr. 1, 2017, pp. 1163-1177, XP011644072, I. Introduction, II. Architecture of the Duty-Cycled PLL-Free TX System, III. Design and Implementation of the TX.
(Continued)

*Primary Examiner* — Jaison Joseph
(74) *Attorney, Agent, or Firm* — Polsinelli/Qualcomm Incorporated

(57) ABSTRACT

Aspects described herein include devices and methods for smart ultra wideband transmissions. In one aspect, an apparatus includes pulse generation circuitry configured to output a plurality of transmission (TX) pulse samples at a selected signal sample rate, where each pulse sample of the plurality of TX pulse samples comprises a value associated with a pulse amplitude at a corresponding sample time The apparatus includes a plurality of power amplifier (PA) cells, with each PA cell of the plurality of PA cells comprising a corresponding current source and associated gates, and where the associated gates of a PA cell are selectable to configure an on state and an off state. Logic circuitry of the apparatus is configured to set the on state or the off state for each PA cell.

28 Claims, 13 Drawing Sheets

(56) References Cited

U.S. PATENT DOCUMENTS

| | | | |
|---|---|---|---|
| 2004/0223535 A1* | 11/2004 | You ........................ | H04B 1/719 375/130 |
| 2007/0098044 A1* | 5/2007 | Kim ..................... | H04B 1/7174 375/130 |
| 2009/0034650 A1* | 2/2009 | Norimatsu ........... | H04B 1/7174 375/295 |
| 2012/0081183 A1 | 4/2012 | Van Den Bos et al. | |
| 2015/0349726 A1* | 12/2015 | Han ......................... | H03F 3/19 330/250 |
| 2019/0140593 A1* | 5/2019 | Sloushch ................. | H04B 1/00 |

OTHER PUBLICATIONS

International Search Report and Written Opinion—PCT/US2023/072863—ISA/EPO—Dec. 5, 2023.
Khaliev M.S-U., et al., "Types of Modulation in IR Ultra-Wideband Technology", Journal of Physics: Conference Series, vol. 2032, No. 1, Oct. 1, 2021, 5 Pages, XP093104869, The Whole Document.
Mdojkovic M., et al., "A 2.4 GHz ULP OOK Single-Chip Transceiver for Healthcare Applications", IEEE Transactions on Biomedical Circuits Systems, IEEE, US, vol. 5, No. 6, Dec. 1, 2011, pp. 523-534, XP011391510, Iii. Transceiver Architecture and Building Blocks.

* cited by examiner

700

OUTPUT, BY PULSE GENERATION CIRCUITRY, A PLURALITY OF TRANSMISSION (TX) PULSE SAMPLES AT A SELECTED SIGNAL SAMPLE RATE, WHEREIN EACH PULSE SAMPLE OF THE PLURALITY OF TX PULSE SAMPLES COMPRISES A VALUE ASSOCIATED WITH A PULSE AMPLITUDE AT A CORRESPONDING SAMPLE TIME
702

CONFIGURE A PLURALITY OF POWER AMPLIFIER (PA) CELLS BETWEEN AN ON STATE AND AN OFF STATE, WHEREIN EACH PA CELL OF THE PLURALITY OF PA CELLS COMPRISES A CORRESPONDING CURRENT SOURCE AND ASSOCIATED GATES
704

SETTING THE ON STATE OR THE OFF STATE FOR EACH PA CELL OF THE PLURALITY OF PA CELLS USING LOGIC CIRCUITRY COUPLED BETWEEN THE PULSE GENERATION CIRCUITRY AND THE PLURALITY OF PA CELLS DURING THE CORRESPONDING SAMPLE TIME FOR THE VALUE, WHEREIN THE PULSE AMPLITUDE AT THE CORRESPONDING SAMPLE TIME IS ASSOCIATED WITH A NUMBER OF THE PLURALITY OF PA CELLS IN THE ON STATE AT THE CORRESPONDING SAMPLE TIME AS SET BY THE VALUE
706

MEANS FOR OUTPUTTING A PLURALITY OF TRANSMISSION (TX) PULSE SAMPLES AT A SELECTED SIGNAL SAMPLE RATE, WHEREIN EACH PULSE SAMPLE OF THE PLURALITY OF TX PULSE SAMPLES COMPRISES A VALUE ASSOCIATED WITH A PULSE AMPLITUDE AT A CORRESPONDING SAMPLE TIME
802

MEANS FOR CONFIGURING A PLURALITY OF POWER AMPLIFIER (PA) CELLS BETWEEN AN ON STATE AND AN OFF STATE, WHEREIN EACH PA CELL OF THE PLURALITY OF PA CELLS COMPRISES A CORRESPONDING CURRENT SOURCE AND ASSOCIATED GATES
804

MEANS FOR SETTING THE ON STATE OR THE OFF STATE FOR EACH PA CELL OF THE PLURALITY OF PA CELLS USING LOGIC CIRCUITRY, WHEREIN THE PULSE AMPLITUDE AT THE CORRESPONDING SAMPLE TIME IS ASSOCIATED WITH A NUMBER OF THE PLURALITY OF PA CELLS IN THE ON STATE AT THE CORRESPONDING SAMPLE TIME AS SET BY THE VALUE
806

*FIG. 8*

ULTRA WIDEBAND TRANSMITTER

FIELD

The present disclosure relates generally to electronics and wireless communications. For example, aspects of the present disclosure relate to ultra wideband transmitters and data transmission systems.

BACKGROUND

Wireless communication devices and technologies are becoming ever more prevalent. Wireless communication devices generally transmit and receive communication signals. A communication signal is typically processed by a variety of different components and circuits. Ultra wideband communications refer to electromagnetic communications which use a brief time-domain pulse which has a corresponding wide band frequency component. Impulse radio ultra wideband (IR-UWB) is a descriptive term used to refer to certain modern ultra wideband systems. Supporting such systems can involve complex system design choices, and managing complex interactions among device elements and signals.

SUMMARY

Various implementations of systems, methods, and devices within the scope of the appended claims each have several aspects, no single one of which is solely responsible for the desirable attributes described herein. Without limiting the scope of the appended claims, some prominent features are described herein.

Aspects described herein include devices, wireless communication apparatuses, circuits, and modules supporting UWB communications.

In some aspects, an ultra wideband (UWB) communication apparatus is provided for generating a UWB transmission (TX) signal. The UWB communication apparatus includes a TX pulse generation module having a data input and a plurality of pulse sample outputs, wherein the plurality of pulse sample outputs are configured to output a plurality of parallel TX pulse sample data streams comprising values associated with a TX signal amplitude at a corresponding sample time; a serializer having a data output, a clock output, and a plurality of inputs coupled to the plurality of pulse sample outputs, wherein the serializer is configured to serialize the plurality of parallel TX pulse sample data streams into a serialized stream of sample data comprising the values output from the serializer at a selected signal sampling rate; gating circuitry having inputs coupled to the data output and the clock output, and a plurality of gating outputs clocked at the selected signal sampling rate, wherein gating signals at each of the plurality of gating outputs corresponds to a digit of a corresponding value; a plurality of power amplifier (PA) cells, each PA cell of the plurality of PA cells comprising: a PA cell output; amplifier circuitry having an output coupled to the PA cell output; a current source coupled to the amplifier circuitry; and power gating circuitry coupled to the current source, the power gating circuitry having an input coupled to a corresponding gating output of the plurality of gating outputs, wherein the digit of the corresponding value associated with the corresponding gating output selects between an on configuration for the current source and an off configuration for the current source as gated at the selected signal sampling rate; and an output balun having a TX output and a plurality of inputs coupled to the PA cell output of each of the plurality of PA cells, wherein the TX signal amplitude at the TX output is determined by a number of the plurality of PA cells configured in the on configuration by the values at each sample period of the selected signal sampling rate.

In some aspects a method is provided. The method includes operating an ultra wideband (UWB) communication apparatus for operations including outputting, by pulse generation circuitry, a plurality of transmission (TX) pulse samples at a selected signal sample rate, wherein each pulse sample of the plurality of TX pulse samples comprises a value associated with a pulse amplitude at a corresponding sample time; configuring a plurality of power amplifier (PA) cells between an on state and an off state, wherein each PA cell of the plurality of PA cells comprises a corresponding current source and associated gates; and setting the on state or the off state for each PA cell of the plurality of PA cells using logic circuitry coupled between the pulse generation circuitry and the plurality of PA cells during the corresponding sample time for the value, wherein the pulse amplitude at the corresponding sample time is associated with a number of the plurality of PA cells in the on state at the corresponding sample time as set by the value.

In some aspects, another UWB communication apparatus is provided. The UWB communication apparatus includes pulse generation circuitry configured to output a plurality of transmission (TX) pulse samples at a selected signal sample rate, wherein each pulse sample of the plurality of TX pulse samples comprises a value associated with a pulse amplitude at a corresponding sample time; a plurality of power amplifier (PA) cells, each PA cell of the plurality of PA cells comprising a corresponding current source and associated gates, wherein the associated gates of a PA cell are selectable to configure the PA cell between an on state and an off state; and logic circuitry coupled between the pulse generation circuitry and the plurality of PA cells, the logic circuitry configured to set the on state or the off state for each PA cell of the plurality of PA cells during the corresponding sample time for the value, and wherein the pulse amplitude at the corresponding sample time is associated with a number of the plurality of PA cells in the on state at the corresponding sample time as set by the value.

In some implementations according to the aspects above, the UWB communication apparatus operates where a power consumption of each cell of the plurality of PA cells is less than 10 microwatts (uW) when gated to the off state.

In some implementations according to the aspects above, the UWB communication apparatus operates where a set of pulse samples of the plurality of pulse TX samples are associated with a time domain pulse, wherein the time domain pulse has an associated frequency bandwidth of approximately 500 MHz using a 250 MHz positive side and a 250 MHz negative side, and wherein the selected signal sample rate is approximately 4 gigabits per second (Gb/s).

In some implementations according to the aspects above, the UWB communication apparatus further includes an output balun having: inputs coupled to a corresponding positive output of each of the plurality of PA cells and a corresponding negative output of each of the plurality of PA cells; and an output for an UWB TX pulse having an amplitude determined by the number of the plurality of PA cells in the on state at the corresponding sample time as set by the value. In some implementations according to the aspects above, the UWB communication apparatus further includes an antenna coupled to the output of the output balun.

In some implementations according to the aspects above, the UWB communication apparatus operates where the logic circuitry further comprises: a first circuit having a positive data input, a positive phase local oscillator (LO) input, and a first clocked positive data output; a second circuit having the positive data input, a negative phase LO input, and a second clocked positive data output; a third circuit having a negative data input, the negative phase LO input, and a first clocked negative data output; and a fourth circuit having the negative data input and the positive phase LO input, and a second clocked negative data output.

In some implementations according to the aspects above, the UWB communication apparatus operates where each PA cell of the plurality of PA cells comprises: a positive amplitude current output; a negative amplitude current output; and a biased current source and where the associated gates comprise: a first switching transistor coupled between the biased current source and the positive amplitude current output, the first switching transistor configured to switch the PA cell between the on state and the off state by the first clocked positive data output; a second switching transistor coupled between the biased current source and the positive amplitude current output, the second switching transistor configured to switch the PA cell between the on state and the off state by the second clocked positive data output; a third switching transistor coupled between the biased current source and the negative amplitude current output, the third switching transistor configured to switch the PA cell between the on state and the off state by the first clocked negative data output; and a fourth switching transistor coupled between the biased current source and the negative amplitude current output, the fourth switching transistor configured to switch the PA cell between the on state and the off state by the second clocked negative data output.

In some aspects, the apparatuses described above can function in a system that includes a mobile device with a camera for capturing one or more pictures. In some aspects, the apparatuses described above can include a display screen for displaying one or more images or interface displays. In some aspects, additional wireless communication circuitry is provided. The summary is not intended to identify key or essential features of the claimed subject matter, nor is it intended to be used in isolation to determine the scope of the claimed subject matter. The subject matter should be understood by reference to appropriate portions of the entire specification, any or all drawings, and each claim.

The foregoing, together with other features and embodiments, will become more apparent upon referring to the following specification, claims, and accompanying drawings.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

FIG. 7 is a flow diagram illustrating a method in accordance with aspects of the present disclosure.

FIG. 8 is a functional block diagram of an apparatus for smart UWB communications, according to aspects described herein.

DETAILED DESCRIPTION

Figure 1A:
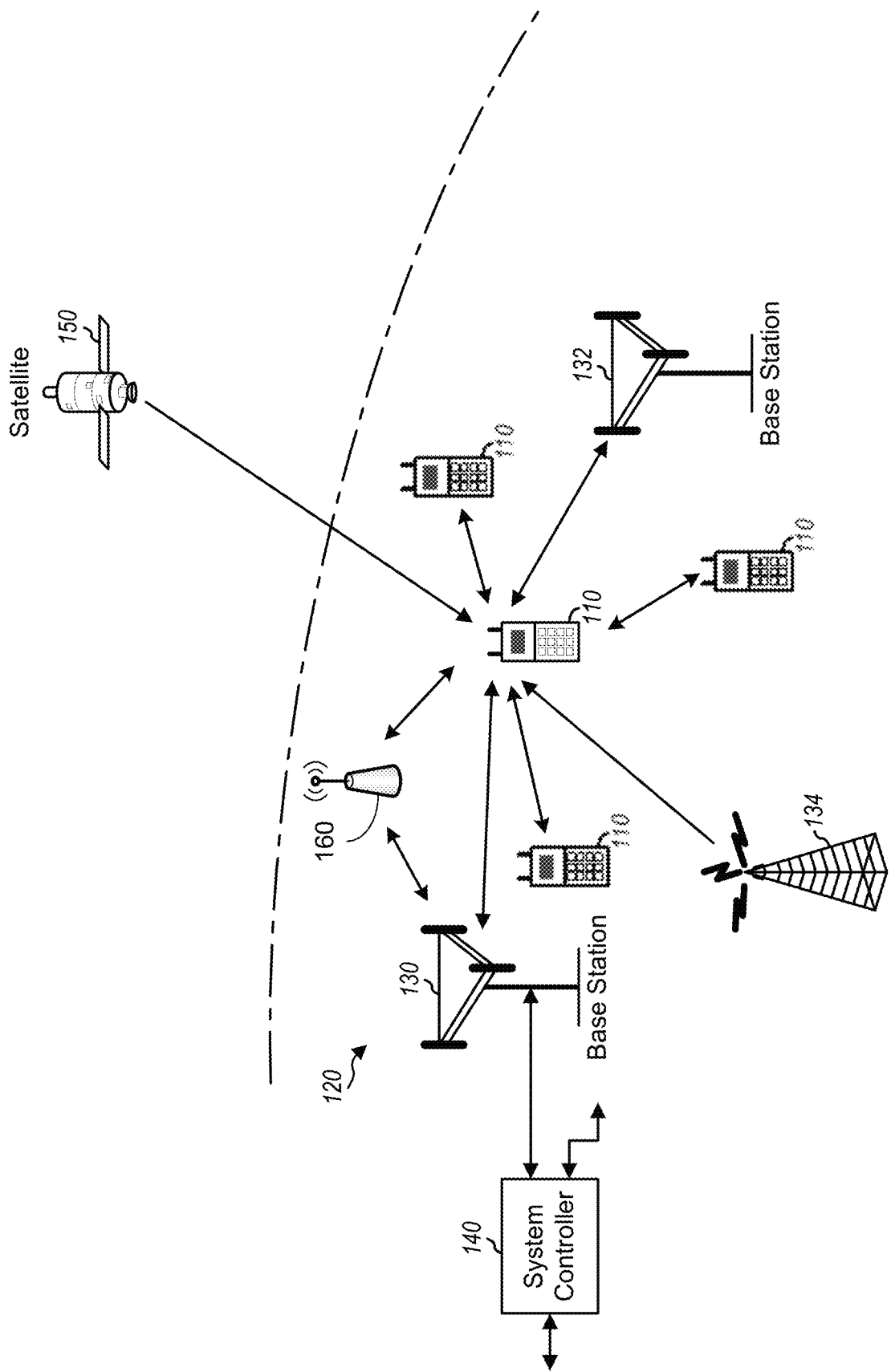
FIG. 1A is a diagram showing a wireless communication system communicating with a wireless device that can be implemented according to aspects described herein.

The detailed description set forth below in connection with the appended drawings is intended as a description of exemplary implementations and is not intended to represent the only implementations in which the invention may be practiced. The term "exemplary" used herein means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form. Drawing elements that are common among the following figures may be identified using the same reference numerals.

Wireless communication systems can include ultra wideband (UWB) communications, and UWB systems can be implemented as impulse radio UWB (IR-UWB) systems. As described in more detail below, IR-UWB systems can operate with transmitters that are constantly switching on and off due to the nature of spread-spectrum, short time domain pulse signals used in UWB systems, combined with a ternary transmission structure that uses 0 values in addition to +1 and −1 values. Prior amplifier-based implementations of such UWB transmitters that meet standard performance criteria (e.g., pulse shaping characteristics, transmission and power performance characteristics, etc.) draw power even when the UWB transmitter is in an idle state (e.g., during a 0 value transmission or during an idle state between −1 or +1 value UWB pulse transmissions). Aspects described herein improve UWB TX performance using digital-to-analog converter (DAC) based TX structures instead of amplifier-based structures. Associated improvements to device performance can include reduced power usage for similar transmissions when compared with amplifier-based UWB TX transmitters.

FIG. 1A is a diagram showing wireless devices 110 communicating within a wireless communication system 120. In accordance with aspects described herein, the wireless devices 110 can include transceivers including an architecture for tracking and correcting phase in accordance with aspects described herein. Further, as described herein, a base station, GNodeB, or other such device as described herein may include MIMO communication elements with transmit and receive chains used for multiple channels or channel beamforming. Examples herein can use the phase tracking and correction for a central PLL frequency which is used for LO generation to distribute a constant signal to the different MIMO channels to maintain performance. The wireless communication system 120 may be a Long Term Evolution (LTE) system, a Code Division Multiple Access (CDMA) system, a Global System for Mobile Communications (GSM) system, a wireless local area network (WLAN) system, a 5G NR (new radio) system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. Communication elements of the wireless device 110 for implementing mmW and non-mmW communications in accordance with any such communication standards can be supported by various designs of transceivers using a chained signal routing. For simplicity, FIG. 1A shows wireless communication system 120 including two base stations 130 and 132 and one system controller 140. In general, a wireless communication system may include any number of base stations and any set of network entities.

The wireless devices 110 may also be referred to as user equipment (UE), a mobile station, a terminal, an access terminal, a subscriber unit, a station, etc. Each wireless device 110 may be a cellular phone, a smartphone, a tablet, or other such mobile devices (e.g., a device integrated with a display screen). Other examples of the wireless devices 110 include an UWB tag (e.g., a miniature device with limited or no inputs or outputs other than the UWB communication systems), a wireless modem, a personal digital assistant (PDA), a handheld device, a laptop computer, a smartbook, a netbook, a tablet, a cordless phone, a medical device, a device configured to connect to one or more other devices (for example through an internet of things connection), a wireless local loop (WLL) station, a Bluetooth device, etc. The wireless devices 110 may communicate with each other or with other aspects of the wireless communication system 120 using various different communication systems. The wireless devices 110 may also receive signals from broadcast stations (e.g., a broadcast station 134) and/or signals from satellites (e.g., a satellite 150 in one or more global navigation satellite systems (GNSS), etc.). The wireless devices 110 may support one or more radio technologies for wireless communication such as IR-UWB, high rate pulse repetition frequency (HRP) UWB, low rate pulse repetition (LPR) UWB, IEEE 802.15.4, 802.15.4z, car connectivity consortium (CCC) UWB, LTE, WCDMA, CDMA 1×, EVDO, TD-SCDMA, GSM, 802.11, 5G, etc. In some systems, the wireless devices 110 can communicate with a simple UWB "tag" (e.g., a small device with simple low power processing and UWB communication systems) using any UWB communication system described herein.

The wireless communication system 120 may also include a wireless device 160. In an exemplary embodiment, the wireless device 160 may be a wireless access point, or another wireless communication device that comprises, or comprises part of a wireless local area network (WLAN). In an exemplary embodiment, the wireless device 110 may be configured as a customer premises equipment (CPE), which may be in communication with a base station 130 and another wireless device 110, or other devices in the wireless communication system 120. In some embodiments, the CPE may be configured to communicate with the wireless device 160 using WAN signaling and to interface with the base station 130 based on such communication instead of the wireless device 160 directly communicating with the base station 130. In exemplary embodiments where the wireless device 160 is configured to communicate using WLAN signaling, a WLAN signal may include WiFi, or other communication signals. In some cases, device 160 may be a radio frequency (RF) tag device (e.g., a device in a small form factor with communication circuitry), which can be used for UWB data communications.

Figure 1B:
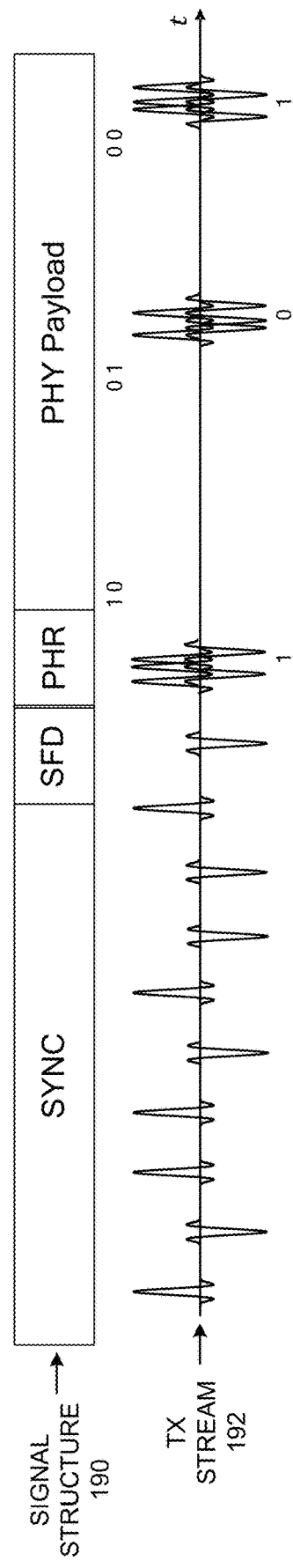
FIG. 1B is an illustration of an ultra wideband signal in accordance with aspects of the present disclosure.

FIG. 1B illustrates aspects of an IR-UWB communication that can be implemented by IR-UWB subsystems of devices (e.g., the wireless devices 110 and 160, etc.) within a communication system such as the system illustrated in FIG. 1A or other such systems when the systems support IR-UWB communications.

Standardization of such systems is related to the Institute of Electrical and Electronic Engineers (IEEE) 802.15.4, which defines frequency band allocations and other details associated with IR-UWB implementations. Such developing impulse radio systems using UWB transmitter can be configured to support pulse-amplitude modulation, which is a form of signal modulation where the data is encoded in signal pulses. IR-UWB signal can be configured similar to binary phase shift keying (BPSK) systems, but with the addition of an idle state in addition to +1 and −1 states, allowing for direct use of ternary code. These ternary pulses can be used for ranging applications as well as data transfer applications. UWB systems are subject to average power limitations and a peak power which is significantly larger than the maximum allowed average power. Such a distinction between peak power and average power is part of the nature of UWB systems, where a brief time domain pulse has a large peak power, and the power is zero or near zero at other times. Additionally, the inclusion of an idle state in the ternary transmission architecture, combined with the nature of UWB pulses, results in UWB transmitter (TX) systems which generate pulses with a relatively large peak power, but having a significant period of time where no transmission is occurring during operating (e.g., active transmission) states.

The illustration of FIG. 1B includes information related to a signal structure 190, and a transmission (TX) stream 192. As illustrated, the TX stream 192 includes very short duration pulses for transmission that are sent over time. As shown, the first pulse in the TX stream 192 is a +1 pulse signal, the second pulse is a −1 pulse signal, and spaces between the pulses may be considered 0 pulse signals in accordance with the ternary transmission structure. The combination of +1, 0, and −1 signals of a synchronization packet may be particularly structured to allow separation and processing to identify a primary wireless path (e.g., as opposed to alternative paths due to reflections, etc.) when establishing a communication connection. The IR-UWB pulses illustrated by the TX stream 192 synchronization preamble can be used for high accuracy ranging and positioning applications, in addition to data communications. The signal structure 190 illustrates aspects of an ranging (HRP) packet format. In various implementations, different such packet or data structures can be used in accordance with aspects of an UWB transmitter described herein. Also as illustrated, the TX stream 192 includes synchronization preamble elements SYNC and STS that can be used for synchronization and ranging between transmitters and receivers of communicating devices. During synchronization operations, a receiver searches for the strongest received data when an environment includes reflections or multiple signals of the synchronization data. The payload header (PHR) and physical layer payload then include data communications, and Rake combining can be used to improve receiver performance by processing UWB pulse information from all received paths.

Table 1 illustrates details of example transmission modes that can be used with UWB transmitters in accordance with aspects described herein. Table 1 illustrates examples of communication system details that may be supported by transmitters described herein, but it will be apparent that other transmission system structures may also be used with the described UWB transmitters.

TABLE 1

| | PRF (MHz) | | | | |
|---|---|---|---|---|---|
| | 3.9 | 15.6 | 62.4 | 124.8 | 249.6 |
| Active pulse duty cycle | 0.78% | 3.125% | 12.5% | 25% | 50% |
| BW/PRF (dB) | 21 | 15 | 9 | 6 | 3 |
| P_average (dBm) | −14.3 | −14.3 | −14.3 | −14.3 | −14.3 |
| P_max_peak (dbm) | 6.779054 | 0.758454 | −5.262145853 | −8.27245 | −11.2827 |
| P_average (dBm/MHz) | −41.2897 | −41.2897 | −41.28970004 | −41.2897 | −41.2897 |

In table 1, UWB modes are described by their pulse repetition frequency (PRF), the active pulse duty cycle which describes how often (e.g., the percentage of time or the percentage of possible pulse periods) the transmitter is transmitting a pulse. For example, in the 249.6 megahertz (MHz) PRF transmission mode, pulses are expected to be transmitted at 50% of the time (e.g., 499.2 MHz*(0.5)). In such an implementation, 50% of the operating time uses +1/−1 data, 0 is used for the remaining 50% of the time. The ratio of the modes (e.g., channel) bandwidth to the PRD, the average power (P_average), the maximum peak (P_max_peak), and the power spectral density (P_average in dBm/MHz) are characteristics of the different UWB modes to comply with transmission standards, regulatory limits, and other such system designs. As illustrated, due to the pulse structure with time between pulses, even in higher duty cycle modes, the maximum peak power of a pulse is 3 dB higher than the average power. The difference occurs since the transmitted power is essentially 0 for a significant portion of the transmit time in such UWB communications. For low pulse duty cycle modes, average power use can stay below a fixed limit, while allowing very large peak power pulses, which can provide functional benefits associated with large pulse signals in some environments while complying with average power and power spectral density limitations.

Figure 1C:
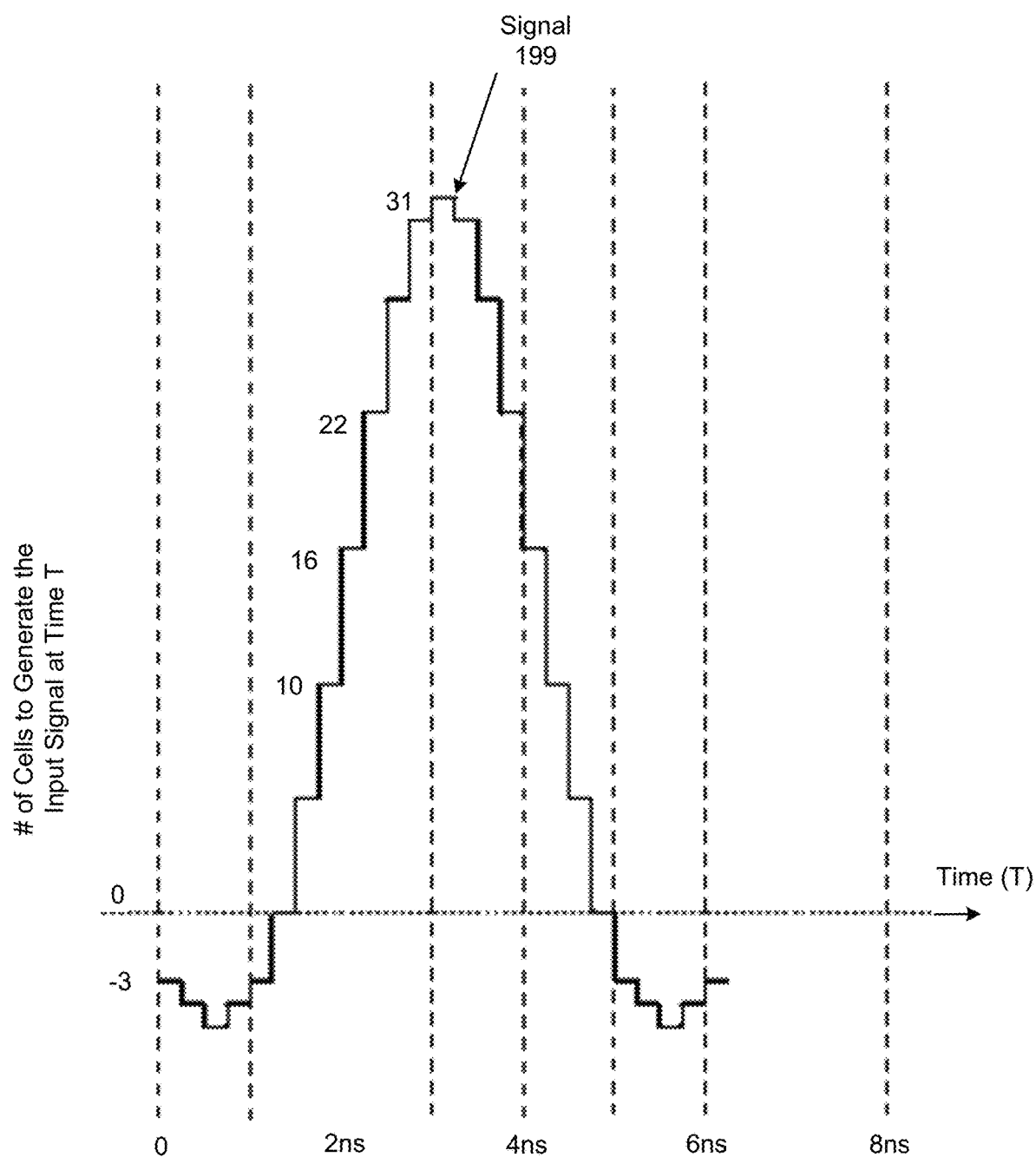
FIG. 1C is a graph illustrating aspects of a TX pulse generator signal in accordance with aspects of the present disclosure.

FIG. 1C is a graph illustrating aspects of a TX pulse generator signal 199 in accordance with aspects of the present disclosure. As illustrated in table 1, UWB communication modes include specific frequency and bandwidth limitations. In order to meet such design details for UWB communications, the time-domain pulse shapes are structured to create signals with the corresponding frequency-domain characteristics for a given communication mode.

FIG. 1C illustrates a discrete signal 199 that can be created by digital TX pulse generator circuitry and used with multiple power amplifier (PA) cells to achieve the appropriate pulse shape and communication characteristics illustrated in the modes of table 1. The signal 199 of FIG. 1C shows an example TX baseband time domain +1 pulse shape as signal 199. When compared against a non-shaped brick wall type of a pulse with a 2 nanosecond (ns) duration, the illustrated TX baseband signal 199 is bandwidth limited in the frequency domain. Rather than a smooth analog curve that would be present if the signal was being generated by analog RF amplifier circuitry, the baseband output used to generate the signal 199 is made up of digital codes. These codes are used to drive the digital PA at the illustrated discrete amplitude levels to generate the signal 199. The codes are generated using logic to set a pulse amplitude at given discrete periods of a pulse. Local oscillator (LO) up-conversion for the code signal is integrated inside the digital power amplifier (PA). The baseband signal amplitude for each discrete time period shown in FIG. 1C is set by the number of cells which are activated at a given time. As shown in FIG. 1C, at time T=0, three cells are used to generate the initial signal (e.g., associated with the desired frequency domain characteristics of the given UWB mode). Positive code values can be used to generate positive amplitude values, and negative code values can be used to generate negative amplitude values in a pulse such as the signal 199. Near the peak amplitude of the pulse, 31 cells are used to generate the peak signal strength. As described below, different data and data—(e.g., data_bar or negative amplitude) signals input into a given power amplifier cell can generate the positive and negative amplitude signals. During the pulse rise and the pulse fall, at discrete clocked times, different numbers of cells are turned on to provide the corresponding signal strength to generate the UWB pulse shape for the particular UWB operating mode.

In different implementations, different numbers of signal oversamples can be used in pulse generation. The number of oversamples is the number of discrete time periods and associated discrete amplitude values corresponding to each discrete time period that is used in a TX signal such as the TX signal 199 to generate the UWB waveform. The example of FIG. 1C shows the TX signal 199 with 8× oversampling. As can be seen, FIG. 1C includes 8 separate time periods in each discrete time UI (unit interval) of 2 ns, each having an associated code, with the signal amplitude level corresponding to the number of cells turned on during each of the 8 time periods in order to generate the corresponding amplitude at a given time of the pulse shape. In other implementations, other oversampling rates can be used (e.g., 6.5, 7, 7.5, etc.). In various other implementations, each pulse has associated limits inside of one UI, and the signal is spread out to multiple UI's in the time domain.

Figure 2:
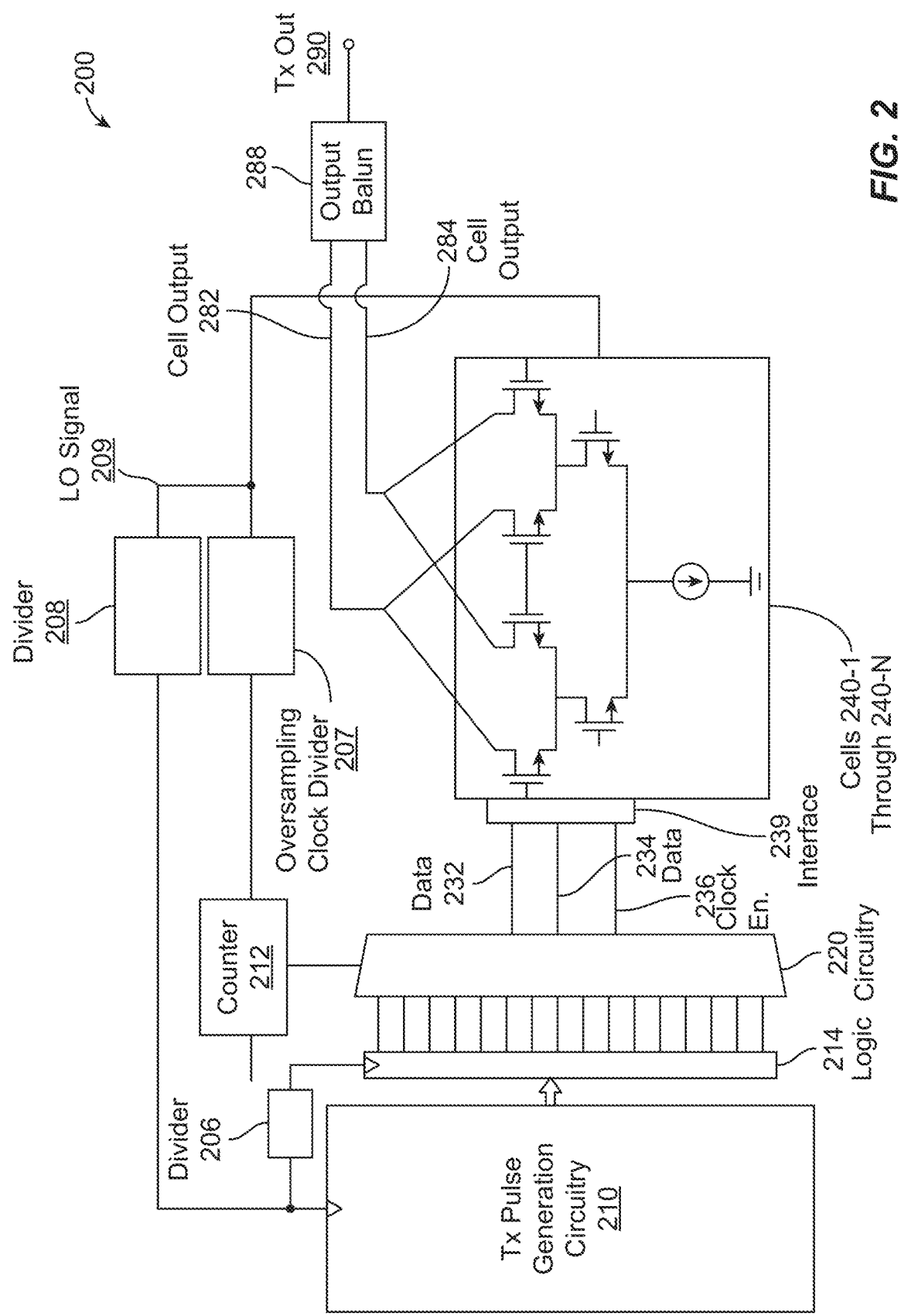
FIG. 2 is a block diagram showing portions of a wireless device which operate in accordance with aspects of the present disclosure.

FIG. 2 is a block diagram showing portions of a wireless device which operate in accordance with aspects of the present disclosure. FIG. 2 particularly shows UWB TX 200, which may be used to generate a TX pulse signal such as the TX pulse signal 199, and to generate a pulse transmission from such a TX pulse signal. The UWB TX 200 may be used in any device implementing UWB functionality, such as device 110, UWB tag devices, or other such devices in a communication system. The UWB TX 200 includes TX pulse generation circuitry 210, logic circuitry 214, Data Serialization circuitry 220, interface 239, a plurality of digital power amplifier (PA) cells 240-1 through 240-N, counter 212, baseband clock divider circuit 208 and oversampling clock divider circuit 207 (basing on the oversampling rate, oversampling clock rate could be but not limited to be 6.5×, 7×, 7.5× and 8× higher than the baseband clock.)). The LO signal 209 can be distributed to the cells 240 for using in operating the cells and generating the UWB data pulses as described herein. The PA cells 240-1 through 240-N provide combined signal outputs to output balun 288 via cell output 282 and cell output 284. As a whole, UWB TX 200 can be considered as TX circuitry used for UWB baseband waveform construction.

As described above, the UWB pulse shaping creates the appropriate frequency content for a given communication mode. The UWB TX pulse generation circuitry 210 is used to generate the signals to create an UWB TX pulse generation signal similar to the TX pulse signal 199. The output signal from the UWB TX pulse generation circuitry 210 includes digital codes (e.g., values or code values) used by logic circuitry 214 and circuitry 220 to control the plurality of PA cells 240-1 through 240-N in order to achieve the correct signal amplitude at a given time period to create the expected pulse shape. The output signal can, in some implementations, be structured as a plurality of parallel TX pulse sample data streams for a stream of UWB pulses. In some examples, the circuitry 220 is a serializer that takes parallel date from the logic circuitry 214 to generate high speed data. In some examples, the data and data—on connections 232, 234 (e.g., the data bar, or inverse of data signals on the data connection 232), and the signal on the clock enable connection 236 are configured for signals operating at approximately 4 gigabits (Gb) per second (Gb/s). In other implementations, other such data rates can be used. Counter 212 and divider circuit 208 and the oversampling clock divider circuit 207 are used to synchronize the TX pulse generator circuitry, the logic circuitry 214 and circuitry 220, and the cells 240-1 through 240-N to create the UWB pulses at TX output 290. In some implementations, the divider circuit 208 can perform a division by 13/14/15/16, or by any other such function to synchronize the circuits above. Similarly, in some implementations, the divider difference circuitry 206 can perform a divide by 2 function, or any other such function to synchronize the circuits as described above. In various implementations, the divider circuits can take an incoming rate, and modify signals to a standardized rate. In some implementations, the modifications can be fixed. In other implementations, the division values can be programmed or configured for different operating modes with different input and output matched rates.

The data rate for the signals on the data connection 232, the data-connection 234, and the clock enable connection 236 are not at the transmission data rate, but are at the subsampling rate for samples of a UWB used to generate a pulse, as described above with respect to FIG. 1C. In the above described example, where logic circuitry 214 and circuitry 220 generate a 4 GB/s data rate, with an oversampling rate of 8× (e.g., 8 samples per UWB pulse), the transmission data rate will be approximately 500 megabits (Mb) per second (Mb/s). The TX pulse generation circuitry 210 can generate codes for associated +1, 0, and −1 ternary transmission data that are serialized by logic circuitry 214 and circuitry 220 to generate the oversampled data values which are passed to the cells 240 on connections 232, 234 to create the appropriate TX signal amplitude associated with each oversample time period of a given UWB pulse. The TX pulse generation circuitry 210 can be considered digital-to-analog (DAC) circuitry that is taking a ternary data stream, and using the data stream to generate a discrete parallel stream of oversampling data that describes the UWB pulses associated with the ternary data. The logic circuitry 214 and circuitry 220 serialize the parallel oversampling data to generate the oversampling data used to drive cells 240. By performing DAC processing in the lower frequency TX pulse generation circuitry 210, and using serialization in logic circuitry 214 and circuitry 220 to transition to high-speed serial oversampled data, significant power saving is achieved when compared with processing the oversampled data directly.

The data signals provided from the TX pulse generation circuitry can be configured as code values which provide different values to different cells of cells 240-1 through 240-N based on whether a cell is configured in an on status for a given sample time associated with an UWB pulse. To achieve the output value for a pulse shape at a given time, the data connection 232 and data-connection 234 can provide different digital inputs to the different cells to select the number of cells in an on state. The information on the data connection 232 and data-connection 234 can be considered code values or pulse shape values that translate the pulse shape at a given subsampling time (e.g., oversampling time for a TX pulse) to an output amplitude. Interface 239 provides the oversampled data from data connection 232 and data-connection 234 to N PA cells 240-1 through 240-N. Additional details of interface 239 are described below with respect to FIG. 3A. The cells 240-1 through 240-N function as a digital driver to amplify the information from TX pulse generation circuitry 210 to create the UWB pulse. As described above, the oversampled data provides a value indicating the amplitude of the UWB pulse at a given period of time. The higher the amplitude, the greater the number of cells 240 that are turned on. Cells 240 are thus simply toggled between on and off configurations, with no linear amplification of the input signal to each cell. Certain portions of cells can be used for negative portions of a UWB signal (e.g., for a +1 data pulse, portions of the associated oversampling signal will indicate a negative amplitude, as shown at T=0 of FIG. 1C). For −1 data pulses, the input to the PA cells will be used to generate a negative signal. For +1 data pulses, portions of cells associated with positive pulse amplitude are used. For example, in an implementation having 16 possible oversampling amplitude settings, a +1 signal will start by using a small number of the negative signals to associated cells of PA cells 240 (e.g., using data-connection 234 and an inverted LO clock signal LOM on the clock enable connection 236). When the oversampled portion of the pulse signal becomes positive, the data connection 232 provides a signal with an indication to certain of the cells 240 along with a positive LO clock LOP on the clock enable connection 236 to cells of PA cells 240 to generate a positive signal. At the peak amplitude at the center oversamples of the +1 UWB pulse, a large number of cells will be signaled on by the data connection 232 and data-connection 234 signals. The oversampled data and data-signals will then generate a symmetrical (or near symmetrical) $2^{nd}$ half to the pulse, creating a shape similar to the shape shown in FIG. 1C, with the data and data-signals used to indicate to the cells 240 whether the amplitude of the UWB pulse at a given time is positive or negative.

In addition to the above descriptions, in certain implementations, the TX pulse generation circuitry can be configured to generate oversampling data based on overlapping UWB pulses. In such systems, the pulse amplitudes for a data stream can include portions for overlapping UWB pulses where the amplitude of the data stream at the pulse overlap is higher than the peak amplitude of a single pulse. In such configurations, the cell 240 configuration will account for the maximum possible signal associated with overlapping UWB pulses. The limitations on peak power for a given UWB communication mode will account for any peak power signals in a transmission stream associated with overlapping adjacent UWB pulses, if allowed in a given communication mode.

Further, during transmission, while each cell is transitioning between on and off states, the power transmission and the power output at the TX output 290 can be modified by adjusting the "on" power value of the cells 240-1 through 240-N. Such a power adjustment for the PA cells 240 is independent of the UWB shape indicated by the data provided to the cells, and can be configured to allow different transmission power settings for different UWB communication modes.

The UWB TX pulse generation circuitry 210 and the logic circuitry 214 are digital blocks, and so when the data signal is a 0, the power consumption by these blocks is significantly lower than when the data signal is a +1 or a −1. Such corresponding reduction in power use is not present in analog amplifier-based designs. For example, in an implementation with 32 cells used to generate a maximum UWB pulse peak, for portions of the pulse where the pulse shape uses less than 32 cells, the unused cells are in an off state, and drawing relatively low amounts of power. The limited power consumption of off blocks during significant portions of the transmit time (e.g., due to 0 value portions of a ternary data stream, and the shape of UWB pulses where some cells will be off most of the time, even for +1 or −1 data), results in improved device operation with UWB pulses generated with relatively low power usage.

The outputs from the cells are merged at cell output 282 and cell output 284, and provided to the output balun 288 to generate the UWB pulse at TX output 290, which can be transmitted via an antenna attached to the UWB TX 200.

In one implementation, an UWB pulse can be generated with an 8× oversampling rate in a 2 nanosecond (ns) window. With such an 8× oversampling, output codes are updated every 250 picoseconds (ps). Such an output code refresh rate places significant design constraints and costs on associated pulse generation circuitry. By using parallel branches for signal updates, the refresh rate can be much lower. For example, with eight parallel branches output from logic 214, each operating at 500 megahertz (MHz) and circuitry 220 to serialize the parallel branches to output signals for data connection 232 and data-connection 234 operating at 4 gigabits per second Gbps, a similar UWB pulse can be generated with simpler circuitry. The TX pulse generation circuitry 210 can thus control logic block 214 to generate a number of parallel signals operating at a parallel signal rate (e.g., at the sample rate divided by the number of parallel signals, where the sample rate is the UWB signal frequency multiplied by the number of oversamples per UWB pulse).

Figure 3A:
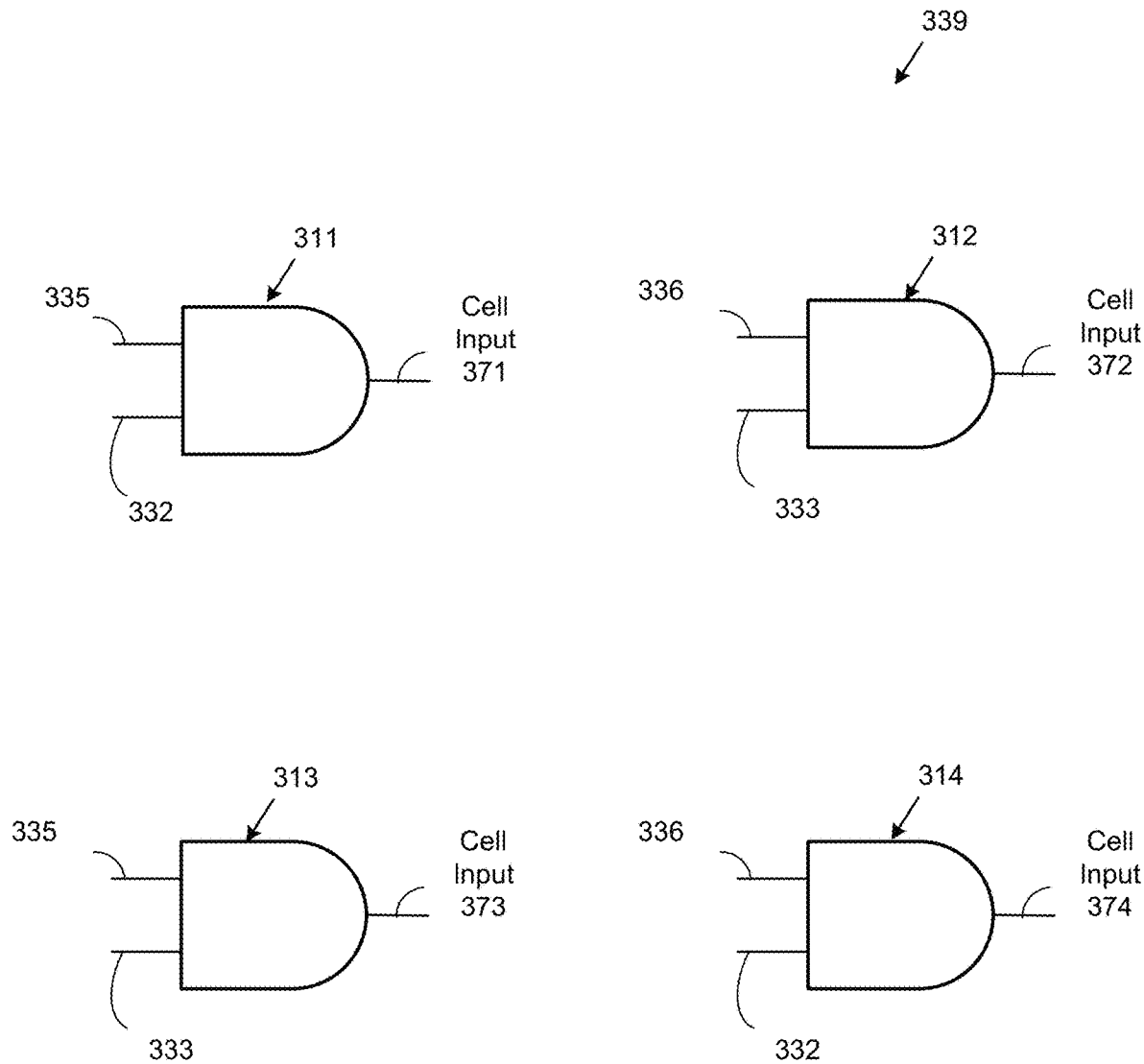
FIG. 3A is a block diagram showing portions of a wireless device configured to interface between TX pulse generation circuitry and power amplifier (PA) cells which operate in accordance with aspects of the present disclosure.

FIG. 3A is a block diagram showing portions of a wireless device to interface between TX pulse generation circuitry and power amplifier (PA) cells which operate in accordance with aspects of the present disclosure. FIG. 3A shows an implementation of aspects of interface 339 which can be similar to interface 239 of FIG. 2. As described above, the circuitry 220 provides data (e.g., positive amplitude oversampling data) and data- (e.g., positive amplitude oversampling data) signals on data connection 232 and data-connection 234, along with a local oscillator (LO) signal on the clock enable connection 236. Interface 339 illustrates circuitry for connecting the positive and negative oversampling data to an individual PA cell, such as the PA cell 340 described below in FIG. 3B. For an implementation with N PA cells, N versions of interface 339 will be used to provide data and clock signals to the cell.

In the implementation associated with interface 339, two clock signals are present, rather than a single clock connection indicated by FIG. 2. This includes a positive LO (LOP) signal, and a negative LO (LOM) signal. The positive and negative clock signals are each mixed with the positive oversampled data (e.g., from the data connection 232) and negative oversampled data (e.g., from the data-connection 234) using circuits 311, 312, 313, and 314. In one implementation, the inputs to circuits 311 through 314 are positive oversampled data signals at cell input 332, negative oversampled data signals at cell input 333, positive LO at cell input 335, and negative LO at cell input 336. These signals are mixed in four combinations as shown using circuits 311, 312, 313, and 314 to generate four corresponding cell inputs 371, 372, 373, and 374.

Figure 3B:
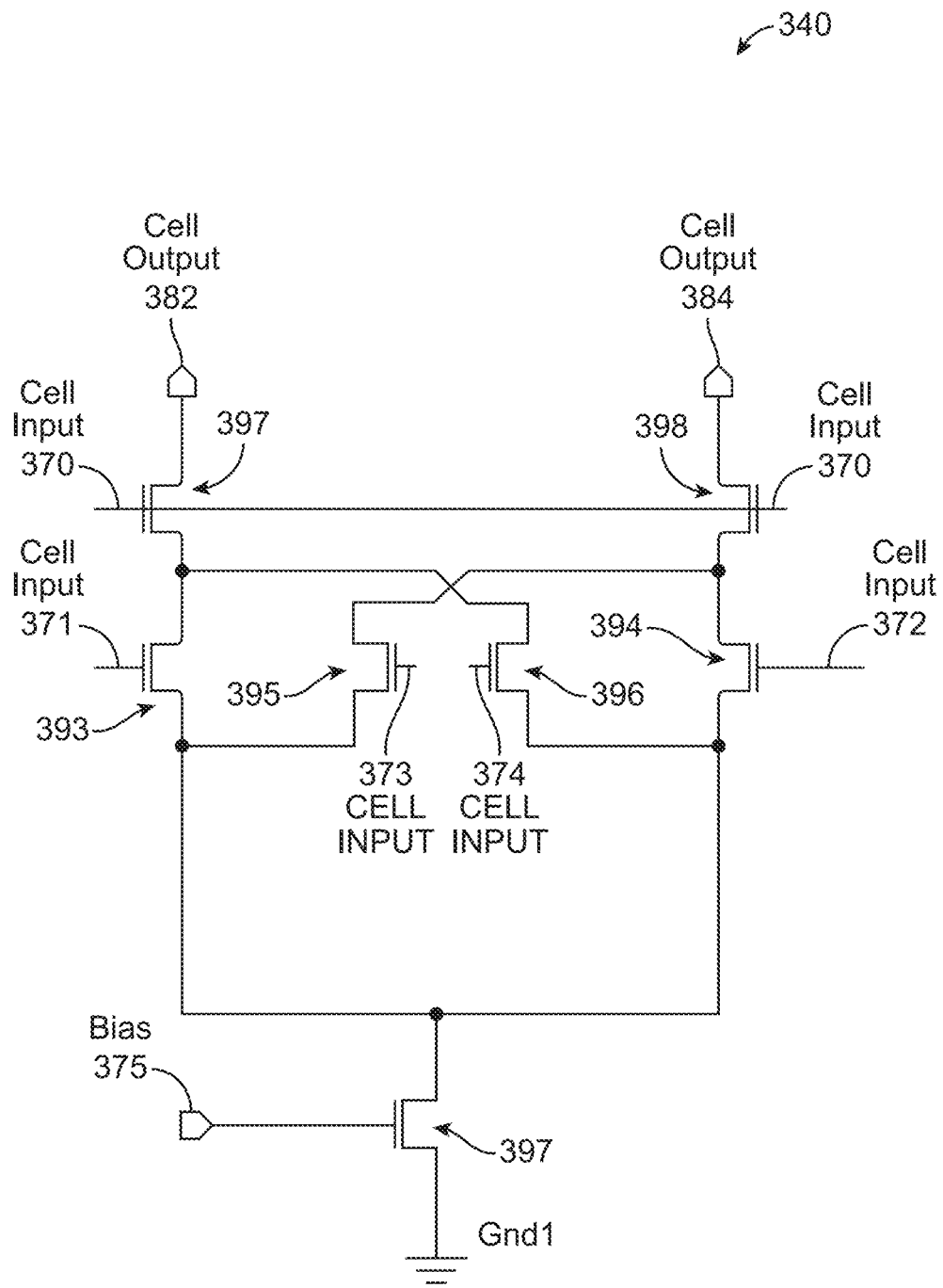
FIG. 3B is a block diagram showing an implementation of PA cells in a wireless device which operates in accordance with aspects of the present disclosure.

FIG. 3B is a block diagram showing an implementation of a PA cell 340 in a wireless device which operate in accordance with aspects of the present disclosure. The PA cell 340 may be an implementation of each of PA cells 240-1 through 240N. The PA cell 340 includes cascode transistors 397 and 398 which receive a cascode bias via cell input 370. Switching transistors 393, 394, 396, and 396 each correspond to an input from circuits 311, 312, 313, and 314 of interface 339 of FIG. 3A. Transistor 397 and bias 375 act as a biased current source to control the power output for an on signal when PA cell 340 is activated as part of an oversampled portion of a UWB pulse as described above. Cell output 382 provides the current output for positive cell signals. Cell output 384 provides the current output for negative cell signals. Each of the switching transistors 393, 394, 395, and 396 act as a gated-on selection for when the corresponding clock and data signal are both positive. Cell input 371 corresponds to a positive amplitude oversampled data signal (e.g., a positive data signal) and a positive phase clock signal LOP. Cell input 374 corresponds to a positive data signal and a negative phase clock signal LOM. Cell input 372 corresponds to a negative amplitude oversampled data signal (e.g., a negative data signal) clock signal LOP. The cell input 333 corresponds to a negative data signal and clock signal LOM.

As described above, particular cells of a set of N cells in a UWB TX as described herein only provide an output signal when the particular cell is needed to contribute to the amplitude of the UWB pulse at a given portion of the pulse shape (e.g., as illustrated by FIG. 1C). When the ternary data in a UWB data stream is 0, or when a cell is not on, all inputs 371, 372, 373, and 374 will be low, with transistors 393, 394, 395, and 396 off, and PA cell 340 drawing little to no power within the device. For example, when powered off, the PA cell 340 may consume little to no power. In some implementations, the PA cell 340 can no power other than the power from transistor leakage current. Such power may, in some implementations, be a few microwatts (uW) of power (e.g., less than 10 uW) due to transistor leakage current in each PA cell when the cell is off. Clocking the LOP and LOM clock signals to the positive and negative data signals allows for discrete distribution of the oversampled data signal to the cells, with low power usage to the unused cells at any given point in the generation of the UWB pulse using the oversampled data signal. For positive amplitudes (e.g., associated with central portions of +1 data pulses or edge portions of −1 data pulses), signals at cell output 382 from all on PA cells will be combined to generate the associated positive amplitude in the UWB pulse. Similarly, for negative amplitudes (e.g., associated with −1 data pulses of the ternary data or peripheral portions of +1 data pulses), signals from cell outputs 384 of all on cells will be combined.

As described above and illustrated in table 1, device operating characteristics such as peak power, average power, and other such operating characteristics can alter between operating modes. Bias 375 can be used to adjust the power provided from individual cells and the contribution of such power to peak and average operating power. In various implementations, bias 375 can be used to adjust such operating characteristics to conform with a given operating mode.

Figure 4:
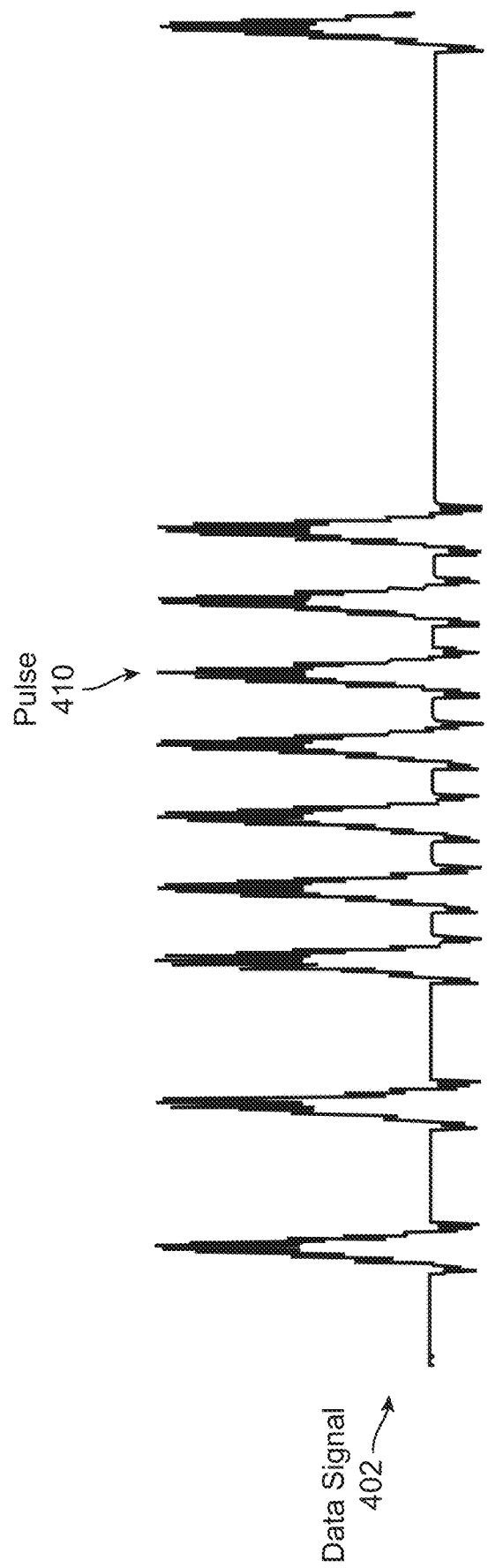
FIG. 4 is an illustration of an ultra wideband signal in accordance with aspects of the present disclosure.

FIG. 4 is an illustration of an ultra wideband signal in accordance with aspects of the present disclosure. FIG. 4 illustrates a data signal 402 including a plurality of +1 ternary pulses, along with 0 ternary data. The data signal 402 indicates pulse shapes for the +1 pulses, including an individual pulse 410. The data signal 402 at an interface such as the interface 239 or the interface 339 will include both positive data, for positive amplitude portions of the UWB pulses, as well as separate negate data, for negative amplitude portions of the UWB pulses. When the logic data from a signal such as the data signal 402 is generated from TX pulse generator circuitry such as the TX pulse generation circuitry, logic and serializer circuitry such as the logic circuitry 214 and the circuitry 220 will distribute the positive and negative oversampled data to the N cells corresponding to the pulse amplitude at a given time, along with the positive and negative LO clock signals.

Figure 5:
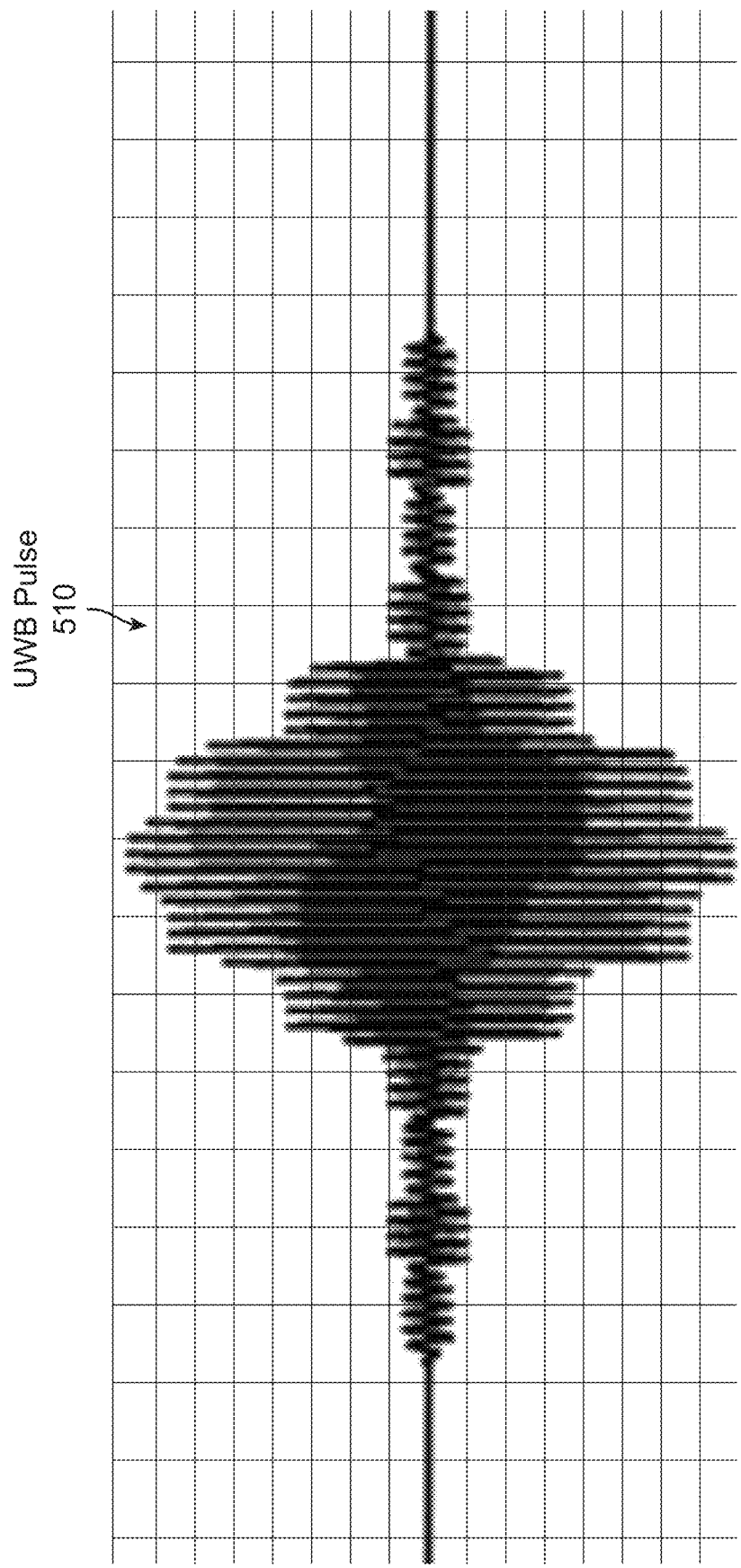
FIG. 5 is an illustration of an ultra wideband pulse in accordance with aspects of the present disclosure.

FIG. 5 is an illustration of an ultra wideband pulse 510 in accordance with aspects of the present disclosure. The ultra wideband pulse 510 illustrates an example signal up converted with an LO from the signal 199 of FIG. 1C, an illustrates aspects of an UWB pulse signal at the Tx output 290 of FIG. 2. The ultrawideband pulse 510 illustrates aspects of one possible chart of a pulse, with time on the horizontal axis, and amplitude on the vertical axis, of a pulse after up conversion mixing with an LO signal. For example, in one implementation, the ultra wideband pulse 510 can represent a signal at the Tx output 290 of FIG. 2, up conversion mixing of the signal 199 generated by the Tx pulse generation circuitry 210, logic 214, circuitry 220, and the cells 240-1 through 240-N.

Figure 6:
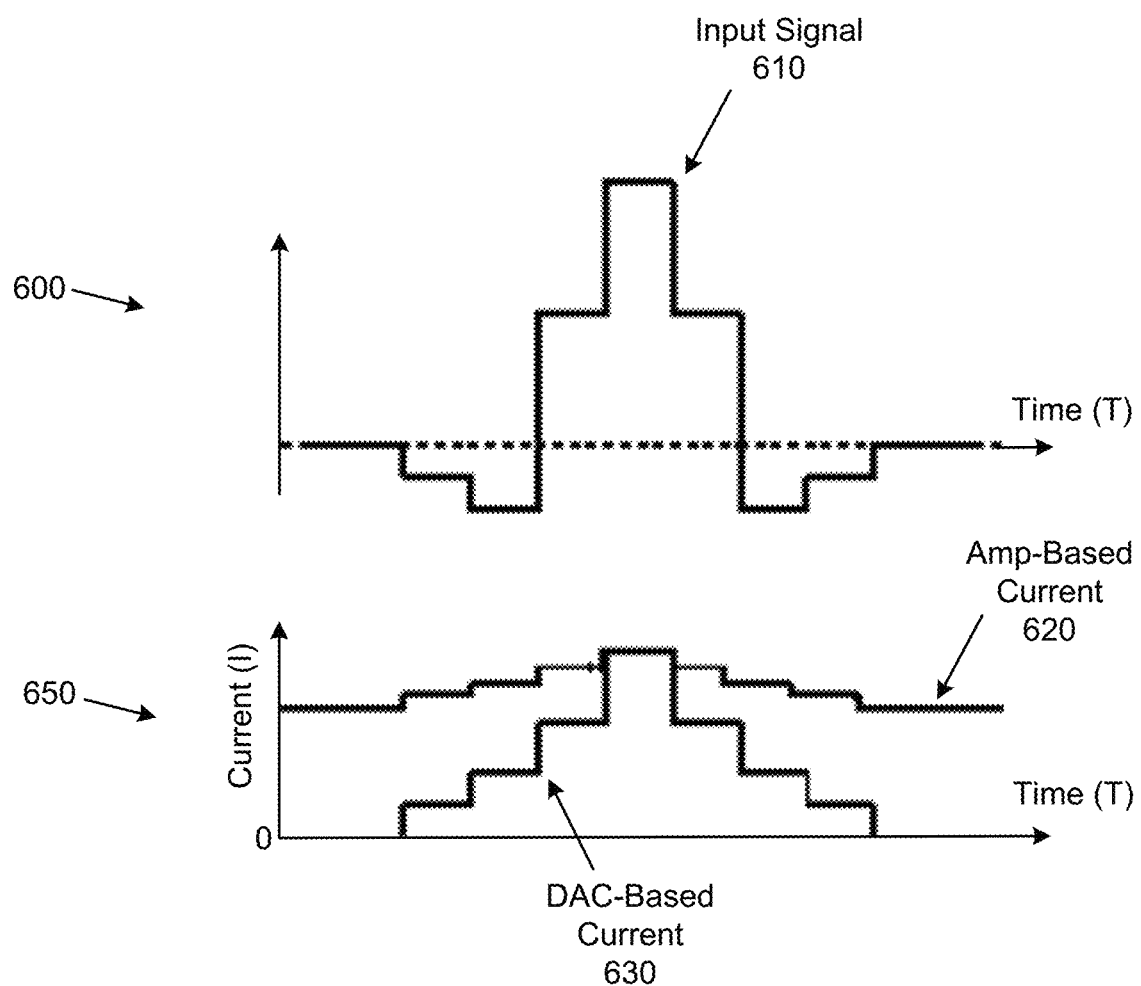
FIG. 6 is a graph illustrating aspects of a TX pulse generator signal, and associated current usage in accordance with aspects of digital-to-analog converter (DAC) based systems of the present disclosure compared with other amplifier based systems.

FIG. 6 is a graph illustrating aspects of a TX pulse generator signal, and associated current usage associated with in accordance with aspects of digital-to-analog converter (DAC) based systems of the present disclosure compared with other amplifier-based systems. The graph 600 shows an 8× oversampled UWB pulse signal as input signal 610, with amplitude graphed against time. Graph 650 shows the same time base as graph 600, but with current draw from a DAC system as described herein shown as DAC-based current 630, along with a comparison of amplitude based current 620 for a similar input signal 610 generation in an amplifier-based system. As illustrated, when the amplitude of the input signal 610 is zero, the current draw of DAC-based current 630 is at or near zero, while the amplifier-based current 620 is non-zero (e.g., due to quiescent currents). Such a comparison extends to 0 signals in a ternary signaling system, where the DAC-based current 630 would remain at or near zero during the 0 signal, while the quiescent current of the amplifier-based system would be significantly larger throughout the 0 signaling time period.

FIG. 7 is a flow diagram describing an example of a method 700 for operation of a device including smart UWB transmitter as described herein. The blocks in the method 700 can be performed in or out of the order shown, and in some embodiments, can be performed at least in part in parallel.

Method 700 includes block 702 which includes outputting, by pulse generation circuitry, a plurality of transmission (TX) pulse samples at a selected signal sample rate, wherein each pulse sample of the plurality of TX pulse samples comprises a value associated with a pulse amplitude at a corresponding sample time;

Method 700 includes block 704 which includes configuring a plurality of power amplifier (PA) cells between an on state and an off state, wherein each PA cell of the plurality of PA cells comprises a corresponding current source and associated gates; and Method 700 includes block 706 which includes setting the on state or the off state for each PA cell of the plurality of PA cells using logic circuitry coupled between the pulse generation circuitry and the plurality of PA cells during the corresponding sample time for the value, wherein the pulse amplitude at the corresponding sample time is associated with a number of the plurality of PA cells in the on state at the corresponding sample time as set by the value.

FIG. 8 is a functional block diagram of an apparatus including a sub-sampling architecture for phase detection, correction, and tracking as described herein. The apparatus 800 comprises means 802 for outputting a plurality of transmission (TX) pulse samples at a selected signal sample rate, where pulse samples of the plurality of TX pulse samples comprise a value associated with a pulse amplitude at a corresponding sample time. The means 802 can, for example, include the TX pulse generation circuitry 210. The apparatus 800 comprises means 804 for configuring a plurality of power amplifier (PA) cells between an on state and an off state, wherein each PA cell of the plurality of PA cells comprises a corresponding current source and associated gates. The apparatus 800 comprises means 806 for setting the on state or the off state for each PA cell of the plurality of PA cells. The means 804 and 806 can include various configurations of the logic 214, the circuitry 220, and the connections 232, 234 with the clock enable connection 236 to generate and provide codes that select PA cell states. In some examples, the means 806 is implemented using logic circuitry coupled between the pulse generation circuitry and the plurality of PA cells during the corresponding sample time for the value, where the pulse amplitude at the corresponding sample time is associated with a number of the plurality of PA cells in the on state at the corresponding sample time as set by the value.

As detailed above, aspects described herein include a DAC UWB TX system with low power usage due to the off-gating and associated low power usage of DAC systems and TX cells between pulses and during 0 value signals. Particular implementations can, for example, achieve average power usage of approximately 40-50 milliwatts (mW) for UWB channels 5, 6, 8, and 9 (e.g., for 802.15.4 HRB standard channels). Such an implementation provides an improvement in device operation when compared with amplifier-based systems for such channels, which can use between 100 mW and 500 mW or more under comparable operating conditions, due to the presence of amplifier based Tx power draws where quiescent currents will always draw power even when the trinary TX system is signaling a zero or is between pulse transmissions. In some implementations, the pulse sample rate can be set to different configurations for different UWB channels. In one aspect, the data rate is 4 gigabits per second (Gbps) and the parallel data rate is 250 megabits per second (Mbps) with 16 parallel outputs for UWB channel 9. In another aspect, for UWB channel 5, the parallel data rate is 250 megabits per second (Mbps) with 13 parallel outputs, which equals to a pulse sample rate of 3.25 gigabits per second. For UWB channel 6, the parallel data rate is 250 megabits per second (Mbps) with 14 parallel outputs, which equals to a pulse sample rate of 3.5 gigabits per second. For UWB channel 8, the parallel data rate is 250 megabits per second (Mbps) with 15 parallel outputs, which equals to a pulse sample rate of 3.75 gigabits per second. In other aspects, other pulse sample rates and parallel data rates can be used.

Figure 9:
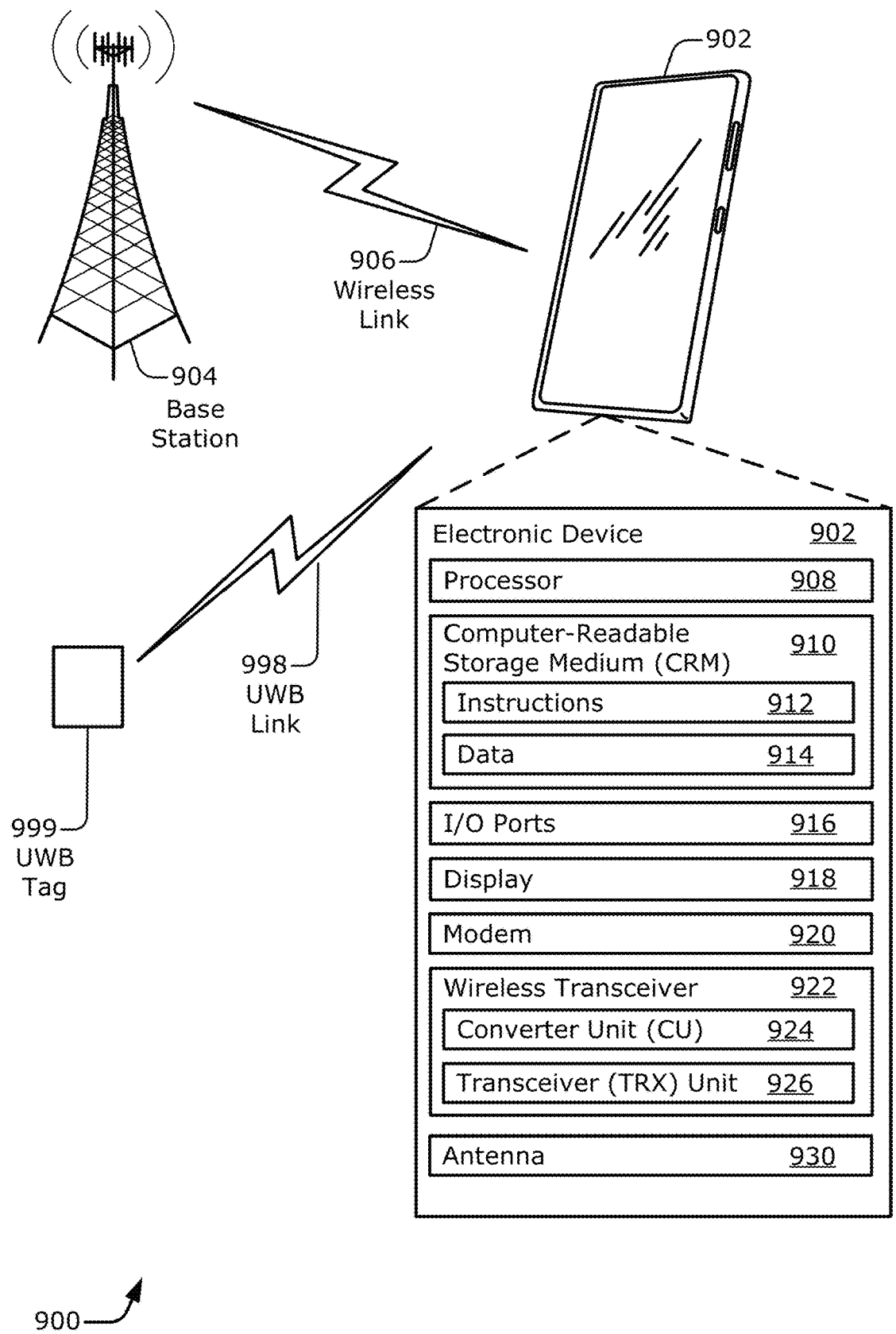
FIG. 9 is a diagram illustrating an environment that includes an electronic device and a base station that can be used with aspects of the present disclosure.

FIG. 9 is a diagram illustrating an exemplary environment 900 that includes an electronic device 902 and a base station 904, each comprising a transceiver (e.g., wireless transceiver 922 of the electronic device 902) or a receiver having a receive path that can include an implementation of an RF power sensor, in accordance with examples described herein. In the environment 900, the electronic device 902 communicates with a base station 904 through a wireless communication link 906 (wireless link 906). In such an example, the electronic device 902 is depicted as a smart phone. However, the electronic device 902 may be implemented as any suitable computing or other electronic device, such as a cellular base station, broadband router, access point, cellular or mobile phone, gaming device, navigation device, media device, laptop computer, desktop computer, tablet computer, server, network-attached storage (NAS) device, smart appliance, vehicle-based communication system, Internet-of-Things (IoT) device, and so forth.

The base station 904 communicates with the electronic device 902 via the wireless link 906, which may be implemented as any suitable type of wireless link. Although depicted as a base station tower of a cellular radio network, the base station 904 may represent or be implemented as another device, such as a satellite, cable television head-end, terrestrial television broadcast tower, access point, peer-to-peer device, mesh network node, router, fiber optic line, another electronic device generally, and so forth. Hence, the electronic device 902 may communicate with the base station 904 or another device via a wired connection, a wireless connection, or a combination thereof.

The wireless link 906 can include a downlink of data or control information communicated from the base station 904 to the electronic device 902 and an uplink of other data or control information communicated from the electronic device 902 to the base station 904. The wireless link 906 may be implemented using IR-UWB or any other UWB communication system in accordance with the TX systems described herein. The wireless link 906 may additionally include any suitable communication protocol or standard, such as 3rd Generation Partnership Project Long-Term Evolution (3GPP LTE), 5G New Radio (3GPP 5GNR), IEEE 802.11, IEEE 802.16, Bluetooth™, and so forth.

In accordance with descriptions herein, the electronic device 902 includes a UWB communication system, including a smart UWB transmitter in accordance with aspects described herein that can, for example, be used to communicate with a small UWB Tag 999 via a UWB link 998. In some implementations, UWB tag 999 circuitry can be integrated with multiple devices similar to the electronic device, allowing electronic devices to communicate with each other via UWB links such as the UWB link 998. In other implementations, smart UWB transmitters and associated receive circuitry can be integrated into any device described herein.

The electronic device 902 includes a processor 908 and a computer-readable storage medium 910 (CRM 910). The processor 908 may include any type of processor, such as an application processor or a multi-core processor, that is configured to execute processor-executable instructions (e.g., code) stored by the CRM 910. The CRM 910 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 910 is implemented to store instructions 912, data 914, and other information of the electronic device 902, and thus does not include transitory propagating signals or carrier waves.

The electronic device 902 may also include input/output ports 916 (I/O ports 916) or a display 918. The I/O ports 916 enable data exchanges or interaction with other devices, networks, or users. The I/O ports 916 may include serial ports (e.g., universal serial bus (USB) ports), parallel ports, audio ports, infrared (IR) ports, and so forth. The display 918 can be realized as a screen or projection that presents graphics, e.g.—one or more graphical images, of the electronic device 902, such as for a user interface associated with an operating system, program, or application. Alternatively, or additionally, the display 918 may be implemented as a display port or virtual interface through which graphical content of the electronic device 902 is communicated or presented.

For communication purposes, the electronic device 902 also includes a modem 920, a wireless transceiver 922, and at least one an antenna 930. The wireless transceiver 922 includes a converter unit (CU) 924 and a transceiver (TRX) unit 926. The wireless transceiver 922 provides connectivity to respective networks and other electronic devices connected therewith using RF wireless signals. Additionally, or alternatively, the electronic device 902 may include a wired transceiver, such as an Ethernet or fiber optic interface for communicating over a personal or local network, an intranet, or the Internet. The wireless transceiver 922 may facilitate communication over any suitable type of wireless network, such as a wireless local area network (LAN) (WLAN) such as Wi-Fi or Bluetooth, a peer-to-peer (P2P) network, a mesh network, a cellular network (e.g., 3GPP2, 4G LTE, 5G NR, or other cellular network), a wireless wide-area-network (WWAN) (e.g., based on 3GPP2, 4G LTE, 5G NR, etc.), a navigational network (e.g., the Global Positioning System (GPS) of North America or another Satellite Positioning System (SPS)), and/or a wireless personal-area-network (WPAN). In the context of the example environment 900, the wireless transceiver 922 enables the electronic device 902 to communicate with the base station 904 and networks connected therewith. Other figures referenced herein may pertain to other wireless networks.

The modem 920, such as a baseband modem, may be implemented as a system on-chip (SoC) that provides a digital communication interface for data, voice, messaging, and other applications of the electronic device 902. The modem 920 may also include baseband circuitry to perform high-rate sampling processes that can include analog-to-digital conversion (ADC), digital-to-analog conversion (DAC), gain correction, skew correction, frequency translation, and so forth. The modem 920 may also include logic to perform in-phase/quadrature (I/Q) operations, such as synthesis, encoding, modulation, demodulation, and decoding. More generally, the modem 920 may be realized as a digital signal processor (DSP) or a processor that is configured to perform signal processing to support communications via one or more networks. Alternatively, ADC or DAC operations may be performed by a separate component or another illustrated component, such as the wireless transceiver 922.

The wireless transceiver 922 can include circuitry, logic, and other hardware for transmitting or receiving a wireless signal for at least one communication frequency band. In operation, the wireless transceiver 922 can implement at least one radio-frequency transceiver unit to process data and/or signals associated with communicating data of the electronic device 902 via the antenna 930. Generally, the wireless transceiver 922 can include filters, switches, amplifiers, and so forth for routing and processing signals that are transmitted or received via the antenna 930. Generally, the wireless transceiver 922 includes multiple transceiver units (e.g., for different wireless protocols such as WLAN versus WWAN or for supporting different frequency bands or frequency band combinations).

The filters, switches, amplifiers, mixers, and so forth of wireless transceiver 922 can include, in one example, at least one single-ended amplifier, switch circuitry, at least one transformer, at least one differential amplifier, and at least one mixer. In some implementations, the single-ended amplifier, which amplifies a strength of a signal, is coupled to the antenna 930. Thus, the single-ended amplifier can couple a wireless signal to or from the antenna 930 in addition to increasing a strength of the signal. In some implementations, the switch circuitry can switchably couple individual transformers a set of transformers to the single-ended amplifier. The set of transformers provides a physical or electrical separation between the single-ended amplifier and other circuitry of the wireless transceiver 922. The set of transformers also conditions a signal propagating through the set of transformers. Outputs of a transformer can be coupled to one or more mixers.

Some examples can use a differential amplifier at the output of the transformer before the signal is input to a mixer. In such examples, the differential amplifier, like the single-ended amplifier, reinforces a strength of a propagating signal. The wireless transceiver can further perform frequency conversion using a synthesized signal and the mixer. The mixer may include an upconverter and/or a downconverter that performs frequency conversion in a single conversion step, or through multiple conversion steps. The wireless transceiver 922 may also include logic (not shown) to perform in-phase/quadrature (I/Q) operations, such as synthesis, encoding, modulation, demodulation, and decoding using a synthesized signal.

In some cases, components of the wireless transceiver 922, or a transceiver unit 926 thereof, are implemented as separate receiver and transmitter entities. Additionally or alternatively, the wireless transceiver 922 can be realized using multiple or different sections to implement respective receiving and transmitting operations (e.g., using separate transmit and receive chains). Example implementations of a transceiver unit 926 are described above. In addition, different wireless protocols such as WWAN and WLAN may be implemented on separate chips or as separate System-on-a-Chips (SoCs). As such, the blocks such as the modem 920 and transceiver 922 may represent more than one modem 920 or transceiver implemented either together on separate chips or separate SoCs.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR) or corresponding mmW elements, (iv) an ASIC such as a mobile station modem (MSM), (v) a module that may be embedded within other devices, (vi) a receiver, cellular phone, wireless device, handset, or mobile unit, (vii) etc.

Figure 10:
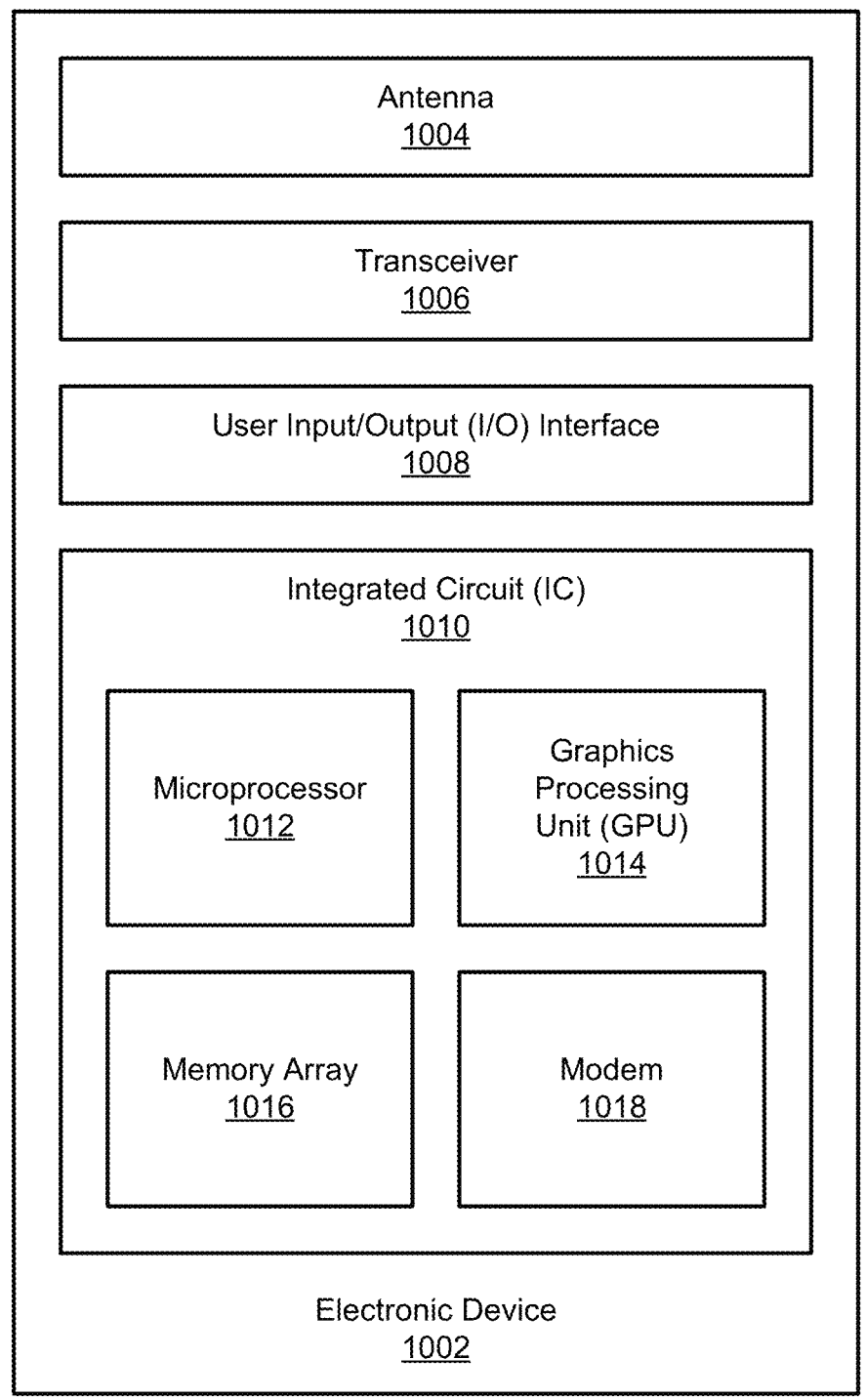
FIG. 10 is a diagram of an electronic device that can be used with aspects of the present disclosure.

FIG. 10 is a diagram illustrating an exemplary electronic device 1002, which includes a transceiver 1006 that can include and/or implement UWB transmissions in accordance with aspects described herein. As shown, the electronic device 1002 includes an antenna 1004, a transceiver 1006, and a user input/output (I/O) interface 1008, in addition to the integrated circuit 1010. Illustrated examples of the integrated circuit 1010, or cores thereof, include a microprocessor 1012, a graphics processing unit (GPU) 1014, a memory array 1016, and a modem 1018. Each component can be operably coupled to another component, such as the GPU 1014 being operably coupled to the user I/O interface 1008.

The electronic device 1002 can be a mobile or battery-powered device or a fixed device that is designed to be powered by an electrical grid. Examples of the electronic device 1002 include a server computer, a network switch or router, a blade of a data center, a personal computer, a desktop computer, a notebook or laptop computer, a tablet computer, a smart phone, an entertainment appliance, or a wearable electronic device such as a smartwatch, intelligent glasses, or an article of clothing. An electronic device 1002 can also be a device, or a portion thereof, having embedded electronics. Examples of the electronic device 1002 with embedded electronics include a passenger vehicle, industrial equipment, a refrigerator or other home appliance, a drone or other unmanned aerial vehicle (UAV), or a power tool.

For an electronic device with a wireless capability, the electronic device 1002 includes an antenna 1004 that is coupled to a transceiver 1006 to enable reception or transmission of one or more wireless signals. The integrated circuit 1010 may be coupled to the transceiver 1006 to enable the integrated circuit 1010 to have access to received wireless signals or to provide wireless signals for transmission via the antenna 1004. The electronic device 1002 as shown also includes at least one user I/O interface 1008. Examples of the user I/O interface 1008 include a keyboard, a mouse, a microphone, a touch-sensitive screen, a camera, an accelerometer, a haptic mechanism, a speaker, a display screen, or a projector. The transceiver 1006 can correspond to, for example, the wireless transceiver 922 (e.g., of FIG. 10), and can include an RF power sensor, in accordance with examples described herein.

The integrated circuit 1010 may comprise, for example, one or more instances of a microprocessor 1012, a GPU 1014, a memory array 1016, a modem 1018, and so forth. The microprocessor 1012 may function as a central processing unit (CPU) or other general-purpose processor. Some microprocessors include different parts, such as multiple processing cores, that may be individually powered on or off. The GPU 1014 may be especially adapted to process visual related data for display, such as video data images. If visual-related data is not being rendered or otherwise processed, the GPU 1014 may be fully or partially powered down. The memory array 1016 stores data for the microprocessor 1012 or the GPU 1014. Example types of memory for the memory array 1016 include random access memory (RAM), such as dynamic RAM (DRAM) or static RAM (SRAM); flash memory; and so forth. If programs are not accessing data stored in memory, the memory array 1016 may be powered down overall or block-by-block. The modem 1018 demodulates a signal to extract encoded information or modulates a signal to encode information into the signal. If there is no information to decode from an inbound communication or to encode for an outbound communication, the modem 1018 may be idled to reduce power consumption. The integrated circuit 1010 may include additional or alternative parts than those that are shown, such as an I/O interface, a sensor such as an accelerometer, a transceiver or another part of a receiver chain, a customized or hard-coded processor such as an application-specific integrated circuit (ASIC), and so forth.

The integrated circuit 1010 may also comprise a system on chip (SoC). An SoC may integrate a sufficient number of different types of components to enable the SoC to provide computational functionality as a notebook computer, a mobile phone, or another electronic apparatus using one chip, at least primarily. Components of an SoC, or an integrated circuit 1010 generally, may be termed cores or circuit blocks. Examples of cores or circuit blocks include, in addition to those that are illustrated in FIG. 10, a voltage regulator, a main memory or cache memory block, a memory controller, a general-purpose processor, a cryptographic processor, a video or image processor, a vector processor, a radio, an interface or communications subsystem, a wireless controller, or a display controller. Any of these cores or circuit blocks, such as a central processing unit or a multimedia processor, may further include multiple internal cores or circuit blocks.

Although selected aspects have been illustrated and described in detail, it will be understood that various substitutions and alterations may be made therein without departing from the spirit and scope of the present invention, as defined by the following claims.

Illustrative aspects of the present disclosure include, but are not limited to:

Aspect 1. An ultra wideband (UWB) communication apparatus, comprising: pulse generation circuitry configured to output a plurality of transmission (TX) pulse samples at a selected signal sample rate, wherein each pulse sample of the plurality of TX pulse samples comprises a value associated with a pulse amplitude at a corresponding sample time; a plurality of power amplifier (PA) cells, each PA cell of the plurality of PA cells comprising a corresponding current source and associated gates, wherein the associated gates of each PA cell are selectable to configure the PA cell between an on state and an off state; and logic circuitry coupled between the pulse generation circuitry and the plurality of PA cells, the logic circuitry configured to set the on state or the off state for each PA cell of the plurality of PA cells during the corresponding sample time for the value, and wherein the pulse amplitude at the corresponding sample time is associated with a number of the plurality of PA cells in the on state at the corresponding sample time as set by the value.

Aspect 2. The UWB communication apparatus of Aspect 1, wherein a power consumption of each cell of the plurality of PA cells in an off state is approximately equal to power consumed by transistor leakage of each cell.

Aspect 3. The UWB communication apparatus of any of Aspects 1 to 2, wherein a set of pulse samples of the plurality of pulse TX samples are associated with a time domain pulse, wherein the time domain pulse has an associated frequency bandwidth of approximately 500 MHz using a 250 MHz positive side and a 250 MHz negative side, and wherein the selected signal sample rate is approximately 4 gigabits per second (Gb/s).

Aspect 4. The UWB communication apparatus of any of Aspects 1 to 3, further comprising an output balun having: inputs coupled to a corresponding positive output of each of the plurality of PA cells and a corresponding negative output of each of the plurality of PA cells; and an output for an UWB TX pulse having an amplitude determined by the number of the plurality of PA cells in the on state at the corresponding sample time as set by the value.

Aspect 5. The UWB communication apparatus of any of Aspects 1 to 4, further comprising an antenna coupled to the output of the output balun.

Aspect 6. The UWB communication apparatus of any of Aspects 1 to 5, wherein the logic circuitry further comprises: a first circuit having a positive data input, a positive phase local oscillator (LO) input, and a first clocked positive data output; a second circuit having the positive data input, a negative phase LO input, and a second clocked positive data output; a third circuit having a negative data input, the negative phase LO input, and a first clocked negative data output; and a fourth circuit having the negative data input and the positive phase LO input, and a second clocked negative data output.

Aspect 7. The UWB communication apparatus of any of Aspects 1 to 6, wherein each PA cell of the plurality of PA cells comprises: a positive amplitude current output; a negative amplitude current output; and a biased current source.

Aspect 8. The UWB communication apparatus of any of Aspects 1 to 7, wherein the associated gates comprise: a first switching transistor coupled between the biased current source and the positive amplitude current output, the first switching transistor configured to switch the PA cell between the on state and the off state by the first clocked positive data output; a second switching transistor coupled between the biased current source and the positive amplitude current output, the second switching transistor configured to switch the PA cell between the on state and the off state by the second clocked positive data output; a third switching transistor coupled between the biased current source and the negative amplitude current output, the third switching transistor configured to switch the PA cell between the on state and the off state by the first clocked negative data output; and a fourth switching transistor coupled between the biased current source and the negative amplitude current output, the fourth switching transistor configured to switch the PA cell between the on state and the off state by the second clocked negative data output.

Aspect 9. The UWB communication apparatus of any of Aspects 1 to 8, wherein the biased current source of each of the plurality of PA cells comprises a bias input coupled to a power control system of the UWB communication apparatus to select a peak output power associated with a maximum number of the PA cells being selected in the on state during a single time period.

Aspect 10. The UWB communication apparatus of any of Aspects 1 to 9, wherein the peak output power is approximately −8 decibels (dBm), and wherein a peak average output power of the UWB communication apparatus is approximately −14.3 dBM when an active pulse duty cycle for the UWB communication apparatus is approximately 25%.

Aspect 11. The UWB communication apparatus of any of Aspects 1 to 10, wherein the peak output power is approximately −11 decibels (dBm), and an peak average output power of the UWB communication apparatus is approximately −14.3 dBm when an active pulse duty cycle for the UWB communication apparatus is approximately 50%.

Aspect 12. The UWB communication apparatus of any of Aspects 1 to 11, wherein the active pulse duty cycle is a percentage of time that a pulse signal is being generated for a +1 or a −1 pulse by the plurality of PA cells compared with a zero amplitude time.

Aspect 13. The UWB communication apparatus of any of Aspects 1 to 12, wherein a power consumption of each cell of the plurality of PA cells is approximately 0 mW when gated to the off state.

Aspect 14. An ultra wideband (UWB) communication apparatus for generating a UWB transmission (TX) signal, the UWB communication apparatus, comprising: a TX pulse generation module having a data input and a plurality of pulse sample outputs, wherein the plurality of pulse sample outputs are configured to output a plurality of parallel TX pulse sample data streams comprising values associated with a TX signal amplitude at a corresponding sample time; a serializer having a data output, a clock output, and a plurality of inputs coupled to the plurality of pulse sample outputs, wherein the serializer is configured to serialize the plurality of parallel TX pulse sample data streams into a serialized stream of sample data comprising the values output from the serializer at a selected signal sampling rate; gating circuitry having inputs coupled to the data output and the clock output, and a plurality of gating outputs clocked at the selected signal sampling rate, wherein gating signals at each of the plurality of gating outputs corresponds to a digit of a corresponding value; a plurality of power amplifier (PA) cells, each PA cell of the plurality of PA cells comprising: a PA cell output; amplifier circuitry having an output coupled to the PA cell output; a current source coupled to the amplifier circuitry; and power gating circuitry coupled to the current source, the power gating circuitry having an input coupled to a corresponding gating output of the plurality of gating outputs, wherein the digit of the corresponding value associated with the corresponding gating output selects between an on configuration for the current source and an off configuration for the current source as gated at the selected signal sampling rate; and an output balun having a TX output and a plurality of inputs coupled to the PA cell output of each of the plurality of PA cells, wherein the TX signal amplitude at the TX output is determined by a number of the plurality of PA cells configured in the on configuration by the values at each sample period of the selected signal sampling rate.

Aspect 15A. The UWB communication apparatus of Aspect 14, wherein a power consumption of each cell of the plurality of PA cells is approximately 0 mW when gated to the off state.

Aspect 15B. The UWB communication apparatus of Aspect 14, wherein a power consumption of each cell of the plurality of PA cells is less than 10 a microwatts (uW) when gated to an off state.

Aspect 16. The UWB communication apparatus of any of Aspects 14 to 15, wherein a set of pulse samples of the plurality of pulse TX samples are associated with a time domain pulse, wherein the time domain pulse has an associated frequency bandwidth of approximately 500 MHz.

Aspect 17. The UWB communication apparatus of any of Aspects 14 to 16, and wherein the selected signal sample rate is approximately 4 gigabits per second (Gb/s).

Aspect 18. The UWB communication apparatus of any of Aspects 14 to 17, and wherein the selected signal sample rate is approximately 2 gigabits per second (Gb/s) with 4× oversampling.

Aspect 19. An method of operating an ultra wideband (UWB) communication apparatus, the method comprising: outputting, by pulse generation circuitry, a plurality of transmission (TX) pulse samples at a selected signal sample rate, wherein each pulse sample of the plurality of TX pulse samples comprises a value associated with a pulse amplitude at a corresponding sample time; configuring a plurality of power amplifier (PA) cells between an on state and an off state, wherein each PA cell of the plurality of PA cells comprises a corresponding current source and associated gates; and setting the on state or the off state for each PA cell of the plurality of PA cells using logic circuitry coupled between the pulse generation circuitry and the plurality of PA cells during the corresponding sample time for the value, wherein the pulse amplitude at the corresponding sample time is associated with a number of the plurality of PA cells in the on state at the corresponding sample time as set by the value.

Aspect 20. The method of Aspect 19, wherein a power consumption of each cell of the plurality of PA cells is less than 1 mW when gated to the off state.

Aspect 21. The method of any of Aspects 19 to 20, wherein a set of pulse samples of the plurality of pulse TX samples are associated with a time domain pulse, wherein the time domain pulse has an associated frequency bandwidth of approximately 500 MHz using a 250 MHz positive side and a 250 MHz negative side, and wherein the selected signal sample rate is approximately 4 gigabits per second (Gb/s).

Aspect 22. The method of any of Aspects 19 to 21, wherein the logic circuitry further comprises: a first circuit having a positive data input, a positive phase local oscillator (LO) input, and a first clocked positive data output; a second circuit having the positive data input, a negative phase LO input, and a second clocked positive data output; a third circuit having a negative data input, the negative phase LO input, and a first clocked negative data output; and a fourth circuit having the negative data input and the positive phase LO input, and a second clocked negative data output.

Aspect 23. The method of any of Aspects 19 to 22, wherein each PA cell of the plurality of PA cells comprises: a positive amplitude current output; a negative amplitude current output; and a biased current source.

Aspect 24. The method of any of Aspects 19 to 23, wherein the associated gates comprise: a first switching transistor coupled between the biased current source and the positive amplitude current output, the first switching transistor configured to switch the PA cell between the on state and the off state by the first clocked positive data output; a second switching transistor coupled between the biased current source and the positive amplitude current output, the second switching transistor configured to switch the PA cell between the on state and the off state by the second clocked positive data output; a third switching transistor coupled between the biased current source and the negative amplitude current output, the third switching transistor configured to switch the PA cell between the on state and the off state by the first clocked negative data output; and a fourth switching transistor coupled between the biased current source and the negative amplitude current output, the fourth switching transistor configured to switch the PA cell between the on state and the off state by the second clocked negative data output.

Aspect 25. The method of any of Aspects 19 to 24, wherein the pulse generation circuitry generates the plurality of TX pulse samples by generating parallel signals and at a parallel data rate, and multiplexing the parallel signals to generate each pulse sample of the plurality of TX pulse samples.

Aspect 26. The method of Aspect 25, wherein the pulse sample rate is 4 gigabits per second (Gbps) and the parallel data rate is 500 megabits per second (Mbps).

Aspect 27. The method of any of Aspects 19 to 24, wherein the biased current source of each of the plurality of PA cells comprises a bias input coupled to a power control system of the UWB communication apparatus to select a peak output power associated with a maximum number of the PA cells being selected in the on state during a single time period.

Aspect 28. The UWB communication apparatus of any of Aspects 19 to 27, wherein an active pulse duty cycle is a percentage of time that a pulse signal is being generated for a +1 or a −1 pulse by the plurality of PA cells compared with a time that the pulse signal is 0.

Aspect 29. A non-transitory computer-readable storage medium comprising instructions stored thereon which, when executed by one or more processors, cause the one or more processors to implement operations according to any of aspects 1 through 28 above.

Aspect 30. An apparatus comprising means for implementing any operation according to any of aspects 1 through 28 above.

What is claimed is:

1. An ultra wideband (UWB) communication apparatus, comprising:
    pulse generation circuitry configured to output a plurality of transmission (TX) pulse samples at a selected signal sample rate, wherein each pulse sample of the plurality of TX pulse samples comprises a value associated with a pulse amplitude at a corresponding sample time;
    a plurality of power amplifier (PA) cells, each PA cell of the plurality of PA cells comprising a corresponding current source and associated gates, wherein the associated gates of each PA cell are selectable to configure the PA cell between an on state and an off state; and
    logic circuitry coupled between the pulse generation circuitry and the plurality of PA cells, the logic circuitry configured to set the on state or the off state for each PA cell of the plurality of PA cells during the corresponding sample time for the value, and wherein the pulse amplitude at the corresponding sample time is associated with a number of the plurality of PA cells in the on state at the corresponding sample time as set by the value.

2. The UWB communication apparatus of claim 1, wherein a power consumption of each cell of the plurality of PA cells in the off state is approximately equal to power consumed by transistor leakage of each cell.

3. The UWB communication apparatus of claim 1, wherein a set of pulse samples of the plurality of TX pulse samples are associated with a time domain pulse, wherein the time domain pulse has an associated frequency bandwidth of approximately 500 MHz using a 250 MHz positive side and a 250 MHz negative side, and wherein an oversampled pulse is applied to limited signal bandwidth in frequency domain.

4. The UWB communication apparatus of claim 1, further comprising an output balun having:
    inputs coupled to a corresponding positive output of each of the plurality of PA cells and a corresponding negative output of each of the plurality of PA cells; and
    an output for an UWB TX pulse having an amplitude determined by the number of the plurality of PA cells in the on state at the corresponding sample time as set by the value.

5. The UWB communication apparatus of claim 4, further comprising an antenna coupled to the output of the output balun.

6. The UWB communication apparatus of claim 1, wherein the logic circuitry further comprises:
    a first circuit having a positive data input, a positive phase local oscillator (LO) input, and a first clocked positive data output;
    a second circuit having the positive data input, a negative phase LO input, and a second clocked positive data output;
    a third circuit having a negative data input, the negative phase LO input, and a first clocked negative data output; and
    a fourth circuit having the negative data input and the positive phase LO input, and a second clocked negative data output.

7. The UWB communication apparatus of claim 6, wherein each PA cell of the plurality of PA cells comprises:
    a positive amplitude current output;
    a negative amplitude current output; and
    a biased current source.

8. The UWB communication apparatus of claim 7, wherein the associated gates comprise:
    a first switching transistor coupled between the biased current source and the positive amplitude current output, the first switching transistor configured to switch the PA cell between the on state and the off state by the first clocked positive data output;
    a second switching transistor coupled between the biased current source and the positive amplitude current output, the second switching transistor configured to switch the PA cell between the on state and the off state by the second clocked positive data output;
    a third switching transistor coupled between the biased current source and the negative amplitude current output, the third switching transistor configured to switch the PA cell between the on state and the off state by the first clocked negative data output; and
    a fourth switching transistor coupled between the biased current source and the negative amplitude current output, the fourth switching transistor configured to switch the PA cell between the on state and the off state by the second clocked negative data output.

9. The UWB communication apparatus of claim 8, wherein the biased current source of each of the plurality of PA cells comprises a bias input coupled to a power control system of the UWB communication apparatus to select a peak output power associated with a maximum number of the PA cells being selected in the on state during a single time period.

10. The UWB communication apparatus of claim 9, wherein the peak output power is approximately −8 decibels (dBm), and wherein a peak average output power of the UWB communication apparatus is approximately −14.3 dBm when an active pulse duty cycle for the UWB communication apparatus is approximately 25%.

11. The UWB communication apparatus of claim 9, wherein the peak output power is approximately −11 decibels (dBm), and an peak average output power of the UWB communication apparatus is approximately −14.3 dBm when an active pulse duty cycle for the UWB communication apparatus is approximately 50%.

12. The UWB communication apparatus of claim 11, wherein the active pulse duty cycle is a percentage of time that a pulse signal is being generated for a +1 or a −1 pulse by the plurality of PA cells compared with a zero amplitude time.

13. The UWB communication apparatus of claim 1, wherein a power consumption of each cell of the plurality of PA cells is less than 10 microwatts (uW) when gated to the off state.

14. An ultra wideband (UWB) communication apparatus for generating a UWB transmission (TX) signal, the UWB communication apparatus, comprising:
   a TX pulse generation module having a data input and a plurality of pulse sample outputs, wherein the plurality of pulse sample outputs are configured to output a plurality of parallel TX pulse sample data streams comprising values associated with a TX signal amplitude at a corresponding sample time;
   a serializer having a data output, a clock output, and a plurality of inputs coupled to the plurality of pulse sample outputs, wherein the serializer is configured to serialize the plurality of parallel TX pulse sample data streams into a serialized stream of sample data comprising the values output from the serializer at a selected signal sampling rate;
   gating circuitry having inputs coupled to the data output and the clock output, and a plurality of gating outputs clocked at the selected signal sampling rate, wherein gating signals at each of the plurality of gating outputs corresponds to a digit of a corresponding value;
   a plurality of power amplifier (PA) cells, each PA cell of the plurality of PA cells comprising:
      a PA cell output;
      amplifier circuitry having an output coupled to the PA cell output;
      a current source coupled to the amplifier circuitry; and
      power gating circuitry coupled to the current source, the power gating circuitry having an input coupled to a corresponding gating output of the plurality of gating outputs, wherein the digit of the corresponding value associated with the corresponding gating output selects between an on configuration for the current source and an off configuration for the current source as gated at the selected signal sampling rate; and
   an output balun having a TX output and a plurality of inputs coupled to the PA cell output of each of the plurality of PA cells, wherein the TX signal amplitude at the TX output is determined by a number of the plurality of PA cells configured in the on configuration by the values at each sample period of the selected signal sampling rate.

15. The UWB communication apparatus of claim 14, wherein a power consumption of each cell of the plurality of PA cells is less than 10 microwatts (uW) when gated to an off state.

16. The UWB communication apparatus of claim 14, wherein a set of pulse samples of the plurality of pulse TX samples are associated with a time domain pulse, wherein the time domain pulse has an associated frequency bandwidth of approximately 500 MHz.

17. The UWB communication apparatus of claim 16, and wherein the selected signal sample rate is approximately 4 gigabits per second (Gb/s).

18. The UWB communication apparatus of claim 16, and wherein the selected signal sample rate is approximately 2 gigabits per second (Gb/s) with 4× oversampling.

19. An method of operating an ultra wideband (UWB) communication apparatus, the method comprising:
   outputting, by pulse generation circuitry, a plurality of transmission (TX) pulse samples at a selected signal sample rate, wherein each pulse sample of the plurality of TX pulse samples comprises a value associated with a pulse amplitude at a corresponding sample time;
   configuring a plurality of power amplifier (PA) cells between an on state and an off state, wherein each PA cell of the plurality of PA cells comprises a corresponding current source and associated gates; and
   setting the on state or the off state for each PA cell of the plurality of PA cells using logic circuitry coupled between the pulse generation circuitry and the plurality of PA cells during the corresponding sample time for the value, wherein the pulse amplitude at the corresponding sample time is associated with a number of the plurality of PA cells in the on state at the corresponding sample time as set by the value.

20. The method of claim 19, wherein a power consumption of each cell of the plurality of PA cells is less than 1 milliwatt (mW) when gated to the off state.

21. The method of claim 19, wherein a set of pulse samples of the plurality of pulse TX samples are associated with a time domain pulse, wherein the time domain pulse has an associated frequency bandwidth of approximately 500 MHz using a 250 MHz positive side and a 250 MHz negative side, and wherein the selected signal sample rate is approximately 4 gigabits per second (Gb/s).

22. The method of claim 19, wherein the logic circuitry further comprises:
   a first circuit having a positive data input, a positive phase local oscillator (LO) input, and a first clocked positive data output;
   a second circuit having the positive data input, a negative phase LO input, and a second clocked positive data output;
   a third circuit having a negative data input, the negative phase LO input, and a first clocked negative data output; and
   a fourth circuit having the negative data input and the positive phase LO input, and a second clocked negative data output.

23. The method of claim 22, wherein each PA cell of the plurality of PA cells comprises:
   a positive amplitude current output;
   a negative amplitude current output; and
   a biased current source.

24. The method of claim 23, wherein the associated gates comprise:
   a first switching transistor coupled between the biased current source and the positive amplitude current output, the first switching transistor configured to switch the PA cell between the on state and the off state by the first clocked positive data output;
   a second switching transistor coupled between the biased current source and the positive amplitude current output, the second switching transistor configured to switch the PA cell between the on state and the off state by the second clocked positive data output;

a third switching transistor coupled between the biased current source and the negative amplitude current output, the third switching transistor configured to switch the PA cell between the on state and the off state by the first clocked negative data output; and a fourth switching transistor coupled between the biased current source and the negative amplitude current output, the fourth switching transistor configured to switch the PA cell between the on state and the off state by the second clocked negative data output.

25. The method of claim 24, wherein the biased current source of each of the plurality of PA cells comprises a bias input coupled to a power control system of the UWB communication apparatus to select a peak output power associated with a maximum number of the PA cells being selected in the on state during a single time period.

26. The method of claim 25, wherein an active pulse duty cycle is a percentage of time that a pulse signal is being generated for a +1 or a −1 pulse by the plurality of PA cells compared with a time that the pulse signal is 0.

27. The method of claim 19, wherein the pulse generation circuitry generates the plurality of TX pulse samples by generating parallel signals and at a lower parallel data rate, and multiplexing the parallel signals to generate each pulse sample of the plurality of TX pulse samples.

28. The method of claim 27, wherein the pulse sample rate is 4 gigabits per second (Gbps) and the parallel data rate is 250 megabits per second (Mbps) with 16 parallel outputs.

* * * * *